(12) United States Patent
Chi et al.

(10) Patent No.: US 7,076,094 B2
(45) Date of Patent: Jul. 11, 2006

(54) METHOD AND APPARATUS FOR DETECTING POSITION OF LEAD OF ELECTRIC COMPONENT, AND ELECTRIC-COMPONENT MOUNTING METHOD

(75) Inventors: Baksa Chi, Chiryu (JP); Seigo Suzuki, Okazaki (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 776 days.

(21) Appl. No.: 10/092,589

(22) Filed: Mar. 8, 2002

(65) Prior Publication Data
US 2002/0136443 A1 Sep. 26, 2002

(30) Foreign Application Priority Data
Mar. 21, 2001 (JP) .............................. 2001-080554

(51) Int. Cl.
*G06K 9/00* (2006.01)
(52) U.S. Cl. .............................. 382/146; 29/833; 438/16
(58) Field of Classification Search ........ 382/146–152; 29/833; 438/16
See application file for complete search history.

(56) References Cited

U.S. PATENT DOCUMENTS

| 4,978,224 A | * | 12/1990 | Kishimoto et al. | ......... 356/394 |
| 6,608,921 B1 | * | 8/2003 | Inoue et al. | ................ 382/146 |
| 6,738,504 B1 | * | 5/2004 | Higashi et al. | ............. 382/146 |

FOREIGN PATENT DOCUMENTS

| JP | 2-057719 B2 | 12/1990 |
| JP | 5-077186 A | 3/1993 |
| JP | 2899121 B2 | 3/1999 |
| JP | 2001-230597 A | 8/2001 |

* cited by examiner

*Primary Examiner*—Samir Ahmed
*Assistant Examiner*—Anand Bhatnagar
(74) *Attorney, Agent, or Firm*—Oliff & Berridge, PLC

(57) ABSTRACT

A method of detecting a position of a lead of an electric component which additionally includes a body from which the lead extends, the method including the steps of illuminating a lengthwise limited portion of the lead, with a light incident thereto in a direction substantially perpendicular to a lengthwise direction of the lead, taking an image of the lead, on a side of a free end of the lead, in a direction parallel to the lengthwise direction of the lead, and detecting the position of the lead by processing image data representing the taken image.

23 Claims, 21 Drawing Sheets

FIG. 21A
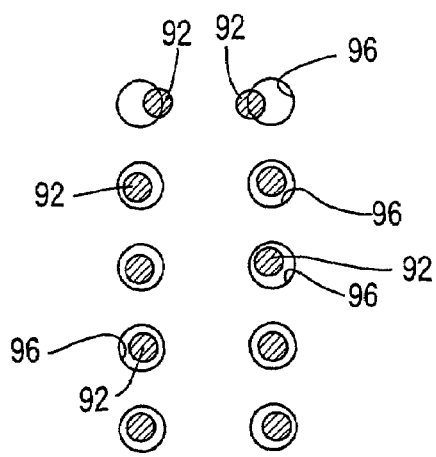
FIG. 21B
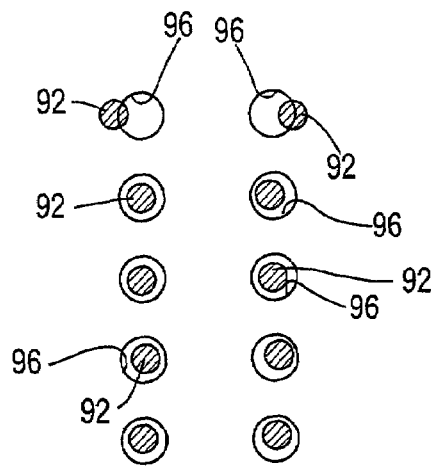
FIG. 21C
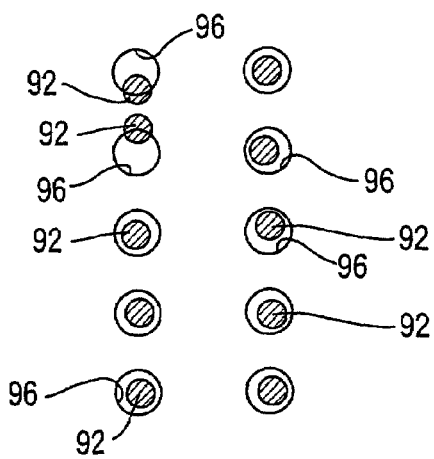
FIG. 21D
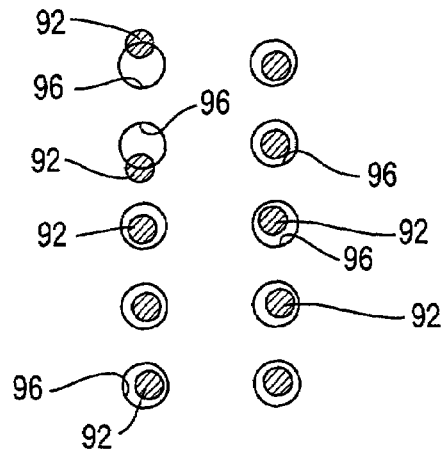
FIG. 21E
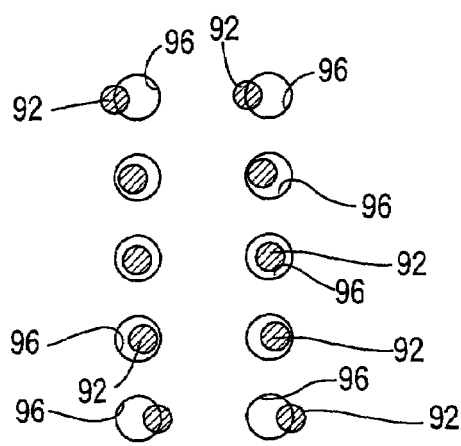
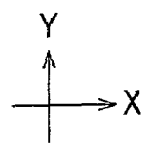

METHOD AND APPARATUS FOR DETECTING POSITION OF LEAD OF ELECTRIC COMPONENT, AND ELECTRIC-COMPONENT MOUNTING METHOD

BACKGROUND OF THE INVENTION

1. Field of the Invention

The present invention relates to a method and an apparatus for detecting a position of a lead of an electric component, and a method of mounting an electric component, and particularly to the art of improving the speed of detection of the position.

2. Discussion of Related Art

There is known an electric component including a body and one or more leads extending from the body. For example, the lead or each of the leads extends from a surface of the body, in a direction perpendicular to the surface, such that a free end of the lead or each lead is positioned away from the surface. The electric component is, e.g., a connector, a relay, or a capacitor.

Japanese Patent No. 2,899,121 discloses an apparatus for detecting a position of a lead of an electric component. For example, when an electric component is mounted on a circuit substrate, a position of a lead of the electric component is detected, and a positional error or a bending of the lead is recognized based on the detected position, so that the electric component may be accurately connected to a prescribed connection position on the circuit substrate.

The lead-position detecting device disclosed in the above-indicated Japanese patent takes an image of a lead in a direction perpendicular to a lengthwise direction of a free end portion of the lead, obtains a shape of a transverse cross section of the free end portion of the lead, i.e., a cross section thereof taken along a plane perpendicular to the lengthwise direction thereof, and detects a position of the lead based on image data representing the taken image. The lead-position detecting device includes an illuminating device and an image-taking device which are provided at respective positions away from the free end portion of the lead in a direction perpendicular to the lengthwise direction thereof. The illuminating device includes a laser diode, a lens which diffuses a horizontal light emitted by the laser diode, and another lens which converts the diffused light into parallel rays, so that the parallel rays are incident to the free end portion of the lead in a direction perpendicular to the lengthwise direction of the lead. The image-taking device is provided by a linear-image sensor which includes a number of light-sensing elements arranged along a straight line which is spaced from the lead and is perpendicular to the lengthwise direction thereof. The linear-image sensor successively takes respective linear images of respective portions of the lead. The image taking device and the illuminating device are revolved as a unit by a revolving device about an axis line parallel to an axis line of the electric component, so that the image-taking device takes respective images of the lead in three directions contained in a plane perpendicular to the lengthwise direction of the lead. Three batches of image data representing the three images of the lead taken in the three directions are processed, that is, the three images obtained from the one lead are processed altogether, so as to determine a transverse-cross-sectional shape of the lead and additionally determine, based on the thus determined shape, a position of the lead.

However, when a position of a lead is obtained in the above-described manner, three batches of image data obtained from the one lead need to be processed. Thus, the conventional lead-position detecting manner is cumbersome and time-consuming.

SUMMARY OF THE INVENTION

The present invention was made in view of the problem encountered in the prior art described above. It is therefore an object of the present invention to make it possible to improve the speed of detection of a position of a lead of an electric component that extends from a surface of a body of the component.

This object may be achieved according to any one of the following features of the present invention in the form of a lead-position detecting method, an electric-component mounting method, and a lead-position detecting apparatus. Each of the following features of the invention is numbered like the appended claims and depends from the other feature or features, where appropriate, to indicate and clarify possible combinations of the technical features. It is to be understood that the present invention is not limited to the technical features or any combinations thereof that will be described for illustrative purposes only. It is to be further understood that a plurality of elements included in any one of the following features of the invention are not necessarily provided altogether, and that the invention may be embodied without some of the elements described with respect to the same feature.

(1) A method of detecting a position of at least one lead of an electric component which additionally includes a body from which said at least one lead extends, the method comprising the steps of illuminating a lengthwise limited portion of the lead, with a light incident thereto in a direction substantially perpendicular to a lengthwise direction of the lead, taking an image of the lead, on a side of a free end of the lead, in a direction parallel to the lengthwise direction of the lead, and detecting the position of the lead by processing image data representing the taken image.

The present invention is particularly suitable for the case where it is needed to detect a position of a lead of an electric component having a nature that as viewed from the side of a free end of the lead, in a direction parallel to a lengthwise direction of the lead, the lead is seen in a background defined by a body of the component. In a particular case where the body has a flat bottom surface, the lead may be one which extends linearly from the bottom surface in a direction perpendicular to the bottom surface, or one which first extends laterally from a side surface of the body and then is perpendicularly bent to finally extend in a direction perpendicular to, and away from, the bottom surface.

A lengthwise limited portion of at least an outer circumferential surface of the lead is illuminated with light, and accordingly at least an annular (e.g., a circular, a rectangular, etc.) portion of the lead is lighted. If an image of the lead is taken on the side of the free end thereof in the direction parallel to the lengthwise direction thereof, the taken image should contain a shape of a transverse cross section of the lead that is defined by at least an annular contour line thereof. Based on image data representing the taken image, a position of the lead can be determined. Although it is preferred that the light be incident to the lead in a direction perpendicular to the lengthwise direction of the lead, the light may be inclined relative to the direction perpendicular to the lengthwise direction of the lead, so long as the light is not incident to the body of the component. In either case, the light is not incident to the body of the component, and the body does not reflect the light. Accordingly, the image of the lead can be taken on the side of the free end thereof in the direction parallel to the lengthwise direction thereof, without being disturbed by the light reflected from the body.

The present invention is also effective in detecting a position of a lead of an electric component having a nature that the lead first extends laterally from a side surface thereof and then is perpendicularly bent to extend in a direction perpendicular to, and away from, the bottom surface of the body. In this case, when the lead is viewed on the side of the free end thereof in the direction parallel to the lengthwise direction thereof, the lead is not seen in the background defined by the bottom surface of the body. Accordingly, it is possible to illuminate a free-end surface of the lead with a light incident thereto, and take an image of the free-end surface. However, the free-end surface may not be flat, or may be a curved surface, such as a spherical surface or a cylindrical surface, or a surface having an undefined shape. In that case, it is difficult to take a light image of an entirety of the free-end surface of the lead. Even in that case, however, the present method can accurately detect a position of the lead by obtaining a transverse-cross-sectional shape of a portion of the lead that is somewhat distant from the free end thereof toward the base end thereof. Thus, the present invention can enjoy its advantage.

In each of the above-described cases, it is only needed to process one batch of image data, and accordingly the processing of the image data can be finished in a short time. Thus, the position of the lead can be determined quickly.

(2) A method according to the first feature (1), wherein the electric component includes a plurality of leads, and wherein the step of detecting the position of the lead comprises detecting a position of one of the leads relative to a position of the other lead.

When an electric component is mounted on a circuit substrate, a plurality of leads of the component are connected to respective connection portions (e.g., respective insertion holes) of the substrate. Therefore, even if those leads may have a positional error relative to the body of the component, the leads may be safely connected to the substrate, so long as the respective positions of the leads relative to each other allow the leads to be connected to the connection portions of the substrate. Thus, whether the electric component can be mounted on the circuit substrate can be judged by detecting the respective positions of the leads relative to each other.

(3) A method according to the first or second feature (1) or (2), wherein the light comprises a planar light which is incident to the lead along a plane substantially perpendicular to the lengthwise direction of the lead.

The lengthwise limited portion of the lead can be easily illuminated by selecting an appropriate thickness of the planar light.

(4) A method according to any one of the first to third features (1) to (3), wherein the limited portion of the lead is distant from the free end thereof by a predetermined distance toward a base end thereof.

According to this feature, the light is not incident to a free-end surface of the lead, and accordingly the image of the lead consists of a thin, light annular line representing a contour line of a transverse-cross-sectional shape of the lead. Therefore, as the width of the limited portion of the lead (i.e., the length of the limited portion of the lead as measured in the lengthwise direction thereof) is decreased, the thickness of the light line representing the transverse-cross-sectional shape of the lead decreases, and the accuracy of detection of the position of the lengthwise limited portion of the lead increases. In addition, as the distance of the limited portion of the lead from the free end thereof is decreased, the degree of approximation of the position of the free end of the lead by the position of the lead detected based on the taken image increases. For example, in the case where the lead of the electric component is inserted in a hole of a circuit substrate, starting with the free end of the lead, the component can be safely mounted on the substrate, if the position of the free end of the lead is detected.

The lengthwise limited portion of the lead is located between, and defined by, two boundaries or positions distant from each other in the lengthwise direction of the lead, i.e., a free-end-side position and a base-end-side position. The free-end-side position is selected depending on the length of the lead (i.e., the length of projection of the lead from the bottom surface of the body), and preferably is distant from the free end of the lead by a distance not greater than one fifth, one tenth, or one fifteenth, of the length of the lead. The base-end-side position is preferably distant from the free-end-side position by a distance not greater than one fifth, one tenth, or one fifteenth, of the length of the lead. If the free-end-side position and the base-end-side position are too near to each other, that is, if the width of the limited portion illuminated with the light is too small, the amount of light to form an image to be taken may be insufficient. In view of this, the lower limit of the width of the portion of the lead that is illuminated with the light is determined. Preferably, the lower limit is not smaller than one twentieth of the length of the lead.

(5) A method according to the first to third features (1) to (3), wherein the limited portion of the lead consists of the free end thereof and a portion thereof adjacent to the free end.

According to this feature, the light is incident to not only an outer circumferential surface of the limited portion of the lead but also a free-end surface as a surface of the free end of the lead, so that a more amount of light is reflected by the lead. In addition, since an outer peripheral portion of the image of the lead is clearly formed by the light incident to the outer circumferential surface of the limited portion, a position of a portion of the lead that is located in the vicinity of the free end thereof can be accurately and easily detected. In the case where a light is incident to only the free-end surface of the lead, a clear light image of the free-end surface may not be taken because of a low degree of flatness of the free-end surface or a rounded outer peripheral portion of the same. That is, the taken image may not have a complete shape or size. Thus, it is difficult to obtain an accurate contour line of the transverse cross sectional shape of the lead. In contrast, according to this feature, the light is incident to not only the free-end surface of the lead but also the outer circumferential surface of the limited portion of the lead that is adjacent to the free-end surface, and accordingly the contour line of the image of the free-end surface is defined by the light reflected by the outer circumferential surface of the limited portion. Thus, the contour line of the image of the free-end surface is not influenced by a low degree of flatness of the surface or a rounded outer peripheral portion of the same. Therefore, the present method can accurate detect the position of the free end of the lead.

According to this feature, the width of the limited portion of the lead is defined by the free end of the lead and a position distant from the free end toward the base end of the lead. The distance of the position from the free end is preferably not greater than one fifth, one tenth, or one fifteenth, of the length of the lead.

(6) A method according to the first to fifth features (1) to (5), wherein the step of illuminating the limited portion of the lead comprises illuminating the limited portion of the lead with the light incident thereto in a plurality of directions substantially directed to the lead in a plane substantially perpendicular to the lengthwise direction of the lead.

For example, in the case where a plurality of leads extend from the body of the electric component, one lead may overlap another lead as viewed in one direction perpendicular to the lengthwise direction of the leads. Even in this case, however, those leads do not overlap each other as viewed in another direction perpendicular to the lengthwise direction. Thus, all the leads are so illuminated with the light as to reflect a light forming respective clear images of the leads.

(7) A method according to the sixth feature (6), wherein the plurality of directions comprise at least three directions.

(8) A method according to the first to seventh features (1) to (7), wherein the light comprises a laser light.

Since a degree of diffusion of the laser light is low, the laser light is suitable for use to illuminate the lengthwise limited portion of the lead.

(9) A method according to the first to eighth features (1) to (8), wherein the step of illuminating the limited portion of the lead comprises illuminating the limited portion of the lead of the electric component held by a component holding head, with the light incident thereto, and wherein the step of taking the image of the lead comprises taking the image of the lead of the electric component held by the component holding head, on the side of the free end of the lead, in the direction parallel to the lengthwise direction of the lead.

The component holding head may be one which includes a component holder such as a suction nozzle that holds the electric component by applying a negative pressure thereto, or one which includes a component gripper that has a plurality of gripping members and holds and releases the electric component by opening and releasing the gripping members.

According to this feature, the detected position of the lead may be used to determine a positional error of the lead relative to the component holding head. In a special case where bending of the lead is negligible, it is possible to determine a positional error of the body of the electric component relative to the holding head. The electric component may be one which has a single lead, or one which has a plurality of leads. In the former case, a detected position of the single lead may be used to determine a position of the body of the electric component relative to the holding head; and in the latter case, respective detected positions of the leads may be used to determine a position of the body of the electric component relative to the holding head.

(10) A method according to the ninth feature (9), further comprising a step of moving the component holding head holding the electric component, in a direction substantially perpendicular to the lengthwise direction of the lead, wherein the step of taking the image of the lead comprises taking the image of the lead of the electric component held by the holding head, midway on a locus of movement of the lead.

According to this feature, the movement of the component holding head may be utilized to position the electric component at a pre-set image-taking or lead-position-detecting position where an image-taking device and/or a lead illuminating device are provided. In this case, it is not needed to employ an exclusive moving or positioning device for positioning the holding head, and accordingly the positioning of the electric component can be effected at low cost. Consequently the position of the lead can be detected at low cost.

(11) A method according to the tenth feature (10), wherein the step of illuminating the limited portion of the lead comprises illuminating the limited portion of the lead of the electric component held by the component holding head, with the light incident thereto from a projector provided at a position offset from the locus of movement of the lead.

According to this feature, the projector does not interfere with the lead, and accordingly the lead can be illuminated with the light, without needing to move the projector with a moving device.

(12) A method according to the first to eleventh features (1) to (11), wherein the electric component comprises a connector which includes at least one lead and which is mounted on a circuit substrate such that said at least one lead is inserted in at least one hole formed in the circuit substrate.

(13) A method of mounting, on a circuit substrate, an electric component including a body and at least one lead extending from the body, the method comprising the steps of holding, with a component holding head, the electric component;

illuminating a lengthwise limited portion of the lead of the electric component held by the component holding head, with a light incident thereto in a direction substantially perpendicular to a lengthwise direction of the lead, and taking an image of the lead, on a side of a free end of the lead, in a direction parallel to the lengthwise direction of the lead, detecting the position of the lead by processing image data representing the taken image, and modifying, based on data representing the detected position of the lead, data representing a reference position of one of the component holding head and the circuit substrate relative to the other of the holding head and the circuit substrate, and inserting the lead of the electric component in a hole formed in the circuit substrate.

The circuit substrate may be a printed-wiring board having no electric components mounted on a printed wiring formed on an insulating substrate thereof; a printed-wiring board having some electric components mounted on a portion of a printed wiring thereof; a small-size circuit substrate on which a small number of electric components are to be mounted; or a substrate having solder bumps to which package-type electric components are to be connected.

When the electric component is mounted on the circuit substrate, at least one of the component holding head and the circuit substrate is positioned relative to the other of the two elements, so that the lead of the component can be inserted in the hole of the substrate. Even if there may be some positional error between the lead and the holding head, the detected position of the lead can be used to determine an amount and a direction of the positional error, which in turn can be used to adjust a relative position of the holding head and the circuit substrate, so that the lead can be inserted in the hole of the substrate.

In the electric-component mounting method according to this feature, the position of the lead can be quickly detected, and the electric component can be quickly mounted on the circuit substrate.

The electric-component mounting method according to this feature may employ any of the second to twelfth features (2) to (12).

(14) A apparatus for detecting a position of at least one lead of an electric component which additionally includes a body from which said at least one lead extends, the apparatus comprising:

a locally illuminating device which illuminates a lengthwise limited portion of the lead with a light incident thereto in a direction substantially perpendicular to a lengthwise direction of the lead;

an image taking device which takes an image of the lead, on a side of a free end of the lead, in a direction parallel to the lengthwise direction of the lead; and an image processing device which detects the position of the lead by processing image data representing the image taken by the image taking device.

The image taking device may be a surface-image taking device which takes, at once, a two-dimensional image of an object, or a line-image sensor which includes a number of light sensing elements arranged along a straight line. Since the line-image sensor takes, at once, a linear image of an object, a two-dimensional image of the object can be obtained as a series of linear images thereof, by repeating image taking operations of the line-image sensor while moving one of the sensor and the object relative to the other of the two elements.

In the case where the surface-image taking device is used to take an image of a long array of leads, an image of a lead positioned in an end portion of the array may not be taken in a direction correctly parallel to the lengthwise direction of the lead. Consequently an image of a lead formed in an outer peripheral portion of an image-forming surface of the image taking device may somewhat differ from that of a lead formed in a central portion of the image-forming surface. In this case, therefore, it may be needed to process the taken image of the long array of leads, while taking into account the above-explained fact. In contrast, in the case where the line-image sensor is used to take an image of a long array of leads, in such a manner that the direction of arrangement of the light sensing elements of the line-image sensor is perpendicular to the array of leads, it is not needed to take into account the above-explained fact, because respective images of respective leads located in an end portion and a central portion of the long array of leads are taken under same conditions.

The locally illuminating device may be one which produces a laser light, or one which produces a common, visible light. The former device may be one which includes a laser diode as a light source; and the latter device may be one which includes a light emitting diode as a light source.

The lead-position detecting apparatus according to this feature may employ any of the second to twelfth features (2) to (12).

(15) A apparatus according to the fourteenth feature (14), further comprising a support member which supports the locally illuminating device and the image taking device.

According to this feature, the common, support member supports the locally illuminating device and the image taking device, and accordingly those two devices can be easily positioned relative to each other.

(16) A apparatus according to the fifteenth feature (15), wherein the support member comprises:

a flat base portion which has, in a central portion thereof, an opening in which the image-taking device fits; and a holding portion which extends from the flat base portion in a direction perpendicular to the flat base portion and which supports the locally illuminating device.

(17) A apparatus according to the sixteenth feature (16), wherein the locally illuminating device comprises a plurality of projectors and wherein the holding portion of the support member comprises a plurality of projector-holding portions which extend from an outer peripheral portion of the flat base portion in the direction perpendicular to the flat base portion and which support the plurality of projectors of the locally illuminating device, respectively.

(18) A apparatus according to any one of the fourteenth to seventeenth features (14) to (17), wherein the locally illuminating device comprises at least one projector which has an outlet and projects the light through the outlet, and wherein the apparatus further comprises:

a support member which supports the projector such that the projector is pivotable about an axis line which is spaced from the lead and is perpendicular to the lead; and an adjusting device which is provided between the projector and the support member and which adjusts an angular position of the projector relative to the support member and thereby adjusts a position where the light projected by the projector is incident to the lead.

Since the position where the light is incident to the lead is adjusted, the light can be accurately incident to the limited portion of the lead.

(19) A apparatus according to the eighteenth feature (18), wherein the projector has the outlet thereof in a vicinity of the axis line thereof.

According to this feature, the position where the light is incident to the lead can be adjusted with a minimized change in a distance between the outlet and the lead in the direction perpendicular to the lengthwise direction of the lead.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIGS. 21A, 21B, 21C, 21D, and 21E are views for explaining how to judge whether the leads can be inserted in the insertion holes of the printed-wiring board, based on the positions of the leads that are detected by the lead-position detecting device;

DETAILED DESCRIPTION OF THE PREFERRED EMBODIMENTS

Figure 1:
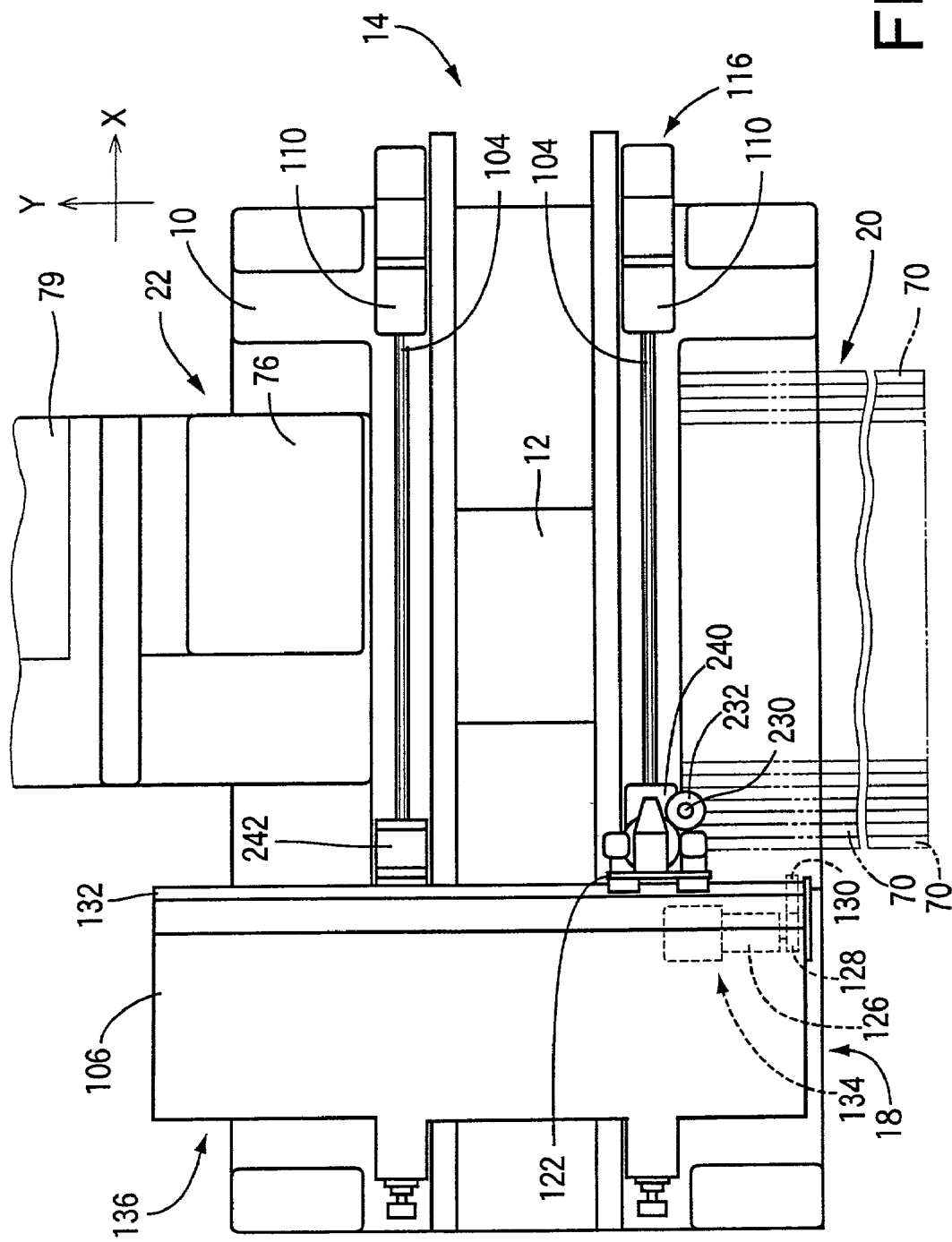
FIG. 1 is a plan view showing an electronic-component mounting system including a lead-position detecting device, to which this invention is applied.

In FIG. 1, reference numeral 10 denotes a machine base of an electronic-component mounting system to which the present invention is applied. The electronic-component mounting system includes a printed-wiring board conveyor (PWB conveyor) 14, a component mounting device 18 and component supply devices 20, 22, which are mounted on the machine base 10. The PWB conveyor 14 is arranged to transfer a circuit substrate in the form of a printed-wiring board 12 in an X-axis direction (in the left and right directions as seen in FIG. 1). The component mounting device 18 is arranged to mount electric components in the form of electronic components on the printed-wiring board 12. The component supply devices 20, 22 are arranged to supply the component mounting device 18 with the electronic components.

In the present embodiment, the printed-wiring board 12 is transferred by the PWB conveyor 14 such that the printed-wiring board 12 maintains a horizontal attitude or posture. The printed-wiring board 12 is stopped by a suitable stopper device (not shown), to be located at a predetermined component-mounting position. The board 12 located at the component-mounting position is supported by a circuit-board support device in the form of a printed-wiring board support device (not shown). In the present electronic-component mounting system, the printed-wiring board 12 is supported such that a component-mounting surface 28 (FIG. 3) of the board 12 on which the electronic components are mounted is parallel to the horizontal plane. The above-indicated X-axis direction in which the board 12 is transferred by the PWB conveyor 14 is parallel to an X axis of an XY coordinate system in an XY plane parallel to the horizontal component-mounting surface 28.

Figure 2:
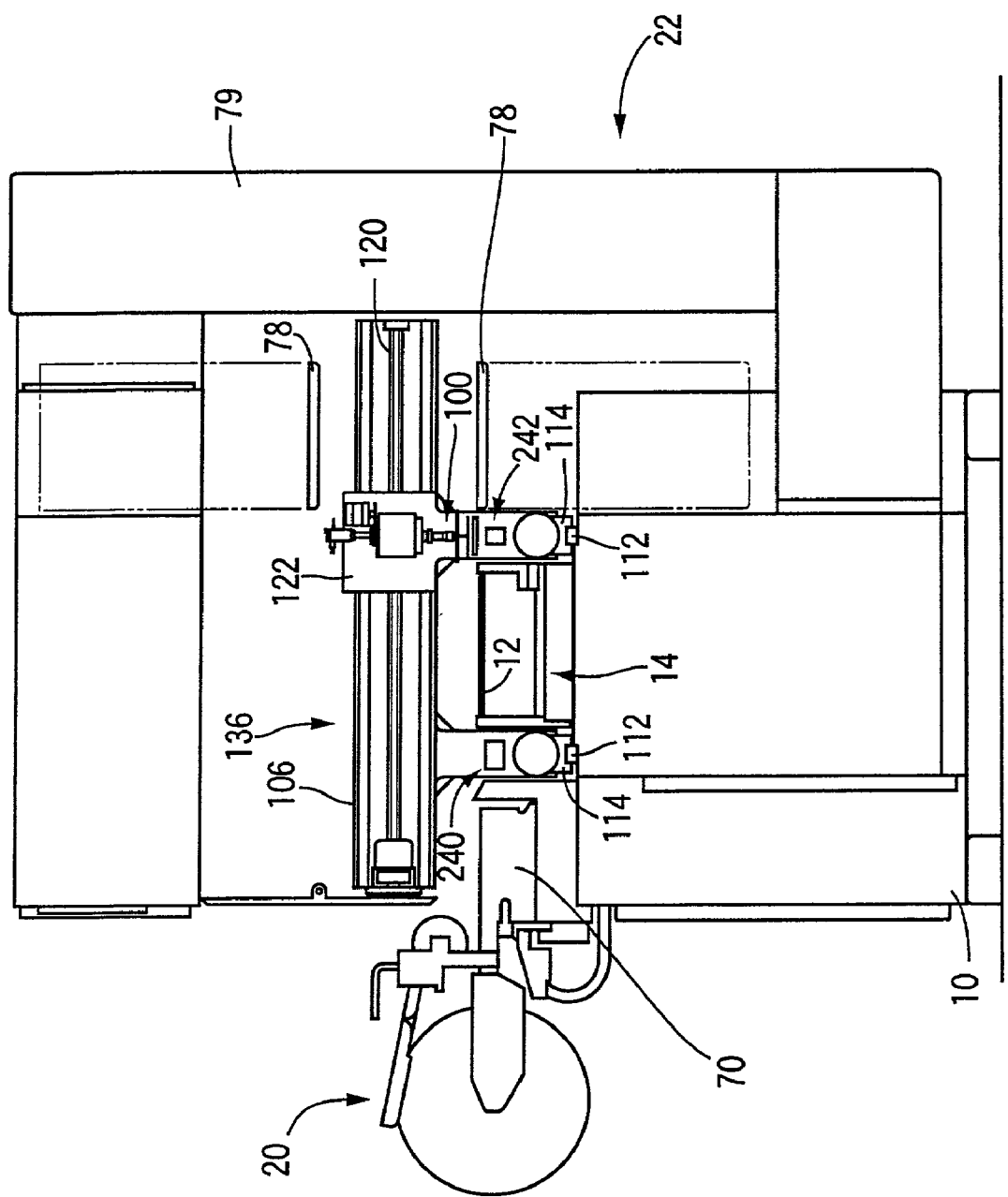
FIG. 2 is a side elevational view of the electronic-component mounting system of FIG. 1.

The component supply devices 20, 22 are spaced from each other in the Y-axis direction perpendicular to the X-axis direction, and are fixedly located on the opposite sides of the PWB conveyor 14, as shown in FIGS. 1 and 2. In the present embodiment, the component supply device 20 is of tape feeder type, while the component supply device 22 is of tray type. The component supply device 20 of tape feeder type includes a multiplicity of tape feeders 70 which are arranged in the X-axis direction. Each tape feeder 70 has a tape cartridge arranged to feed a carrier tape which accommodates electronic components. The carrier tape includes a carrier substrate which has a multiplicity of component-accommodating recesses formed at a suitable interval along the length of the carrier tape. The electronic components are accommodated in the respective component-accommodating recesses. The opening of each component-accommodating recess is closed by a covering film bonded to the carrier substrate, to prevent the electronic components from moving out of the recesses when the carrier tape is fed. In operation of each tape feeder 70, the carrier tape is fed from the tape cartridge, with a predetermined pitch in the Y-axis direction, while the covering film is separated from a lengthwise portion of the carrier substrate which has been fed from the tape cartridge. Thus, the electronic components are fed one after another to a predetermined component-supply position. The electronic components accommodated in the tape feeders 70 include electronic components having leads, and electronic components not having leads.

The component supply device 22 of tray type includes a multiplicity of component trays 76 (FIG. 3) accommodating electronic components. The component trays 76 are accommodated in respective multiple tray boxes 78, which are vertically arranged and are supported by respective support members. The tray boxes 78 are elevated one after another by an elevator device disposed within a column 79 (FIG. 1), to a predetermined component-supply position. For a component holding head 100 (which will be described) of the component mounting device 18 to receive the electronic components from the component tray 76 in the tray box 78 located at the component-supply position, some vertical space must be provided above the component-supply position. To provide this vertical space, the tray box 78 from which the electronic components have been transferred to the component holding head 100 is moved further upwards from the component-supply position to a predetermined retracted position when the next tray box 78 is moved to the component-supply position, so that the required vertical space is provided between the component-supply position and the retracted position. The component supply device 22 of tray type is identical in construction to a component supply device disclosed in Japanese patent document No. 2-57719.

Thus, the component mounting device 18 receives the electronic components one after another from the component tray 76 in the tray box 78 at the component-supply position above which the required vertical space is provided. Each component tray 76 accommodates the electronic components 82 in component accommodating recesses (not shown) which are arranged in a matrix.

Figure 5:
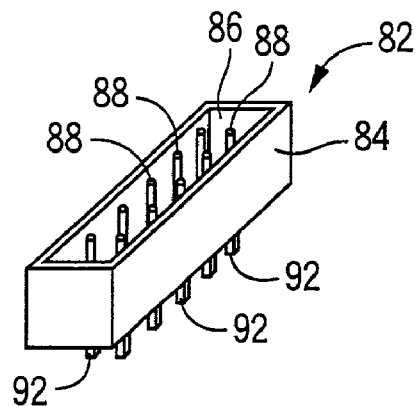
FIG. 5 is a perspective view showing a connector which is mounted on a printed-wiring board by the component mounting device.
Figure 6:
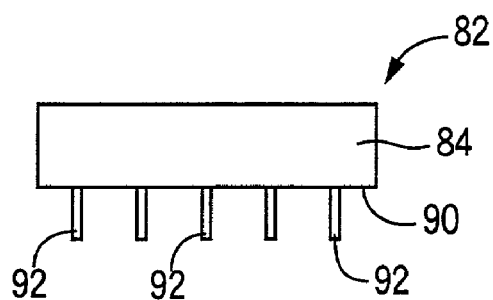
FIG. 6 is a side elevational view of the connector of FIG. 5.
Figure 7:
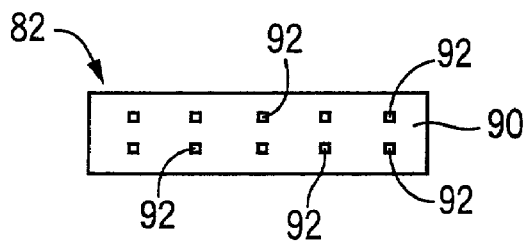
FIG. 7 is a bottom view of the connector.

The component tray 76 supplies, e.g., insertion-type connectors (hereinafter, referred to as the "connectors") 82, each as a sort of electronic component, shown in FIGS. 5, 6, and 7. Each connector 82 includes a body 84 in the form of a rectangular container having an opening 86, and is mounted on the printed-wiring board 12 such that the opening 86 of the connector 82 faces upward. The connector 82 additionally includes a plurality of pins 88 which project from an inner surface of the bottom wall of the body 84 such that respective free end portions of the pins 88 do not project out of the body 84.

Moreover, the connector 82 includes a plurality of straight leads 92 which project from an outer surface 90 of the bottom wall of the body 84 such that the straight leads 92 are perpendicular to the outer surface 90 and parallel to each other. When the connector 82 is mounted on the printed-wiring board 12, the outer surface 90 faces the board 12. Each of the straight leads 92 has a square transverse cross section, and all the leads 92 are arranged in a plurality of (e.g., two) parallel rows in a lengthwise direction of the body 84. Therefore, if each straight lead 92 is seen from the side of a free end thereof in a lengthwise direction thereof, the each lead 92 is completely contained in the outer surface 90 of the body 84.

Each connector 82 is accommodated in one component accommodating recess of the component tray 76, such that the opening 86 of the body 84 of the connector 82 faces upward, the straight leads 92 thereof are vertical, the body 84 is positioned relative to the tray 76, and the leads 92 are supported on the tray 76. Alternatively, each connector 82 may be accommodated in one accommodating recess of the component tray 76, such that the body 84 thereof is positioned relative to the tray 76 and additionally is supported on the same 76.

Figure 8:
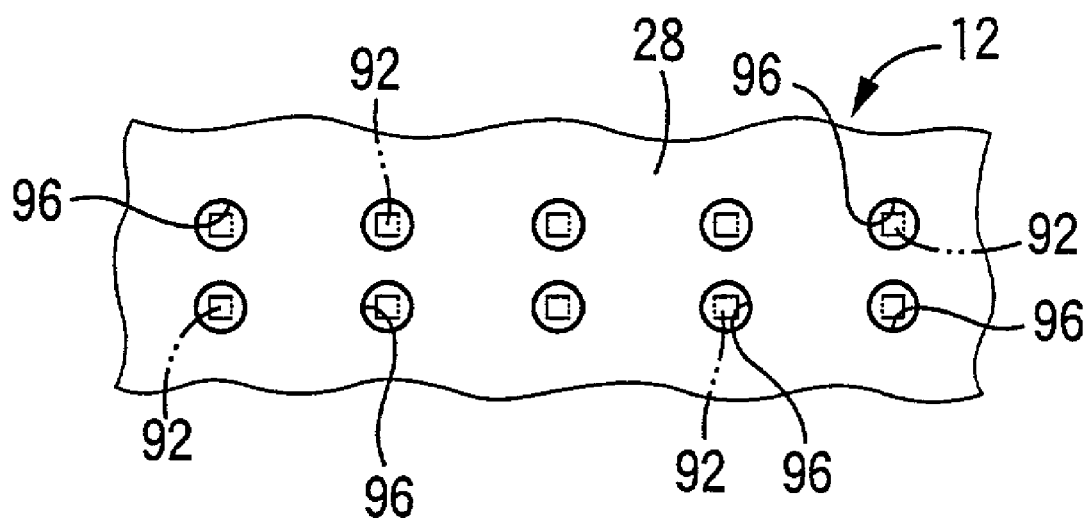
FIG. 8 is a plan view showing a state in which leads of the connector are inserted in respective insertion holes of the printed-wiring board.

The printed-wiring board 12 has, as shown in FIG. 8, a plurality of insertion holes 96 which open in the component-mounting surface 28 and in which the plurality of straight leads 92 of the connector 82 are inserted. Each of the insertion holes 96 has a circular transverse cross section that is somewhat larger than that of each lead 92.

Figure 3:
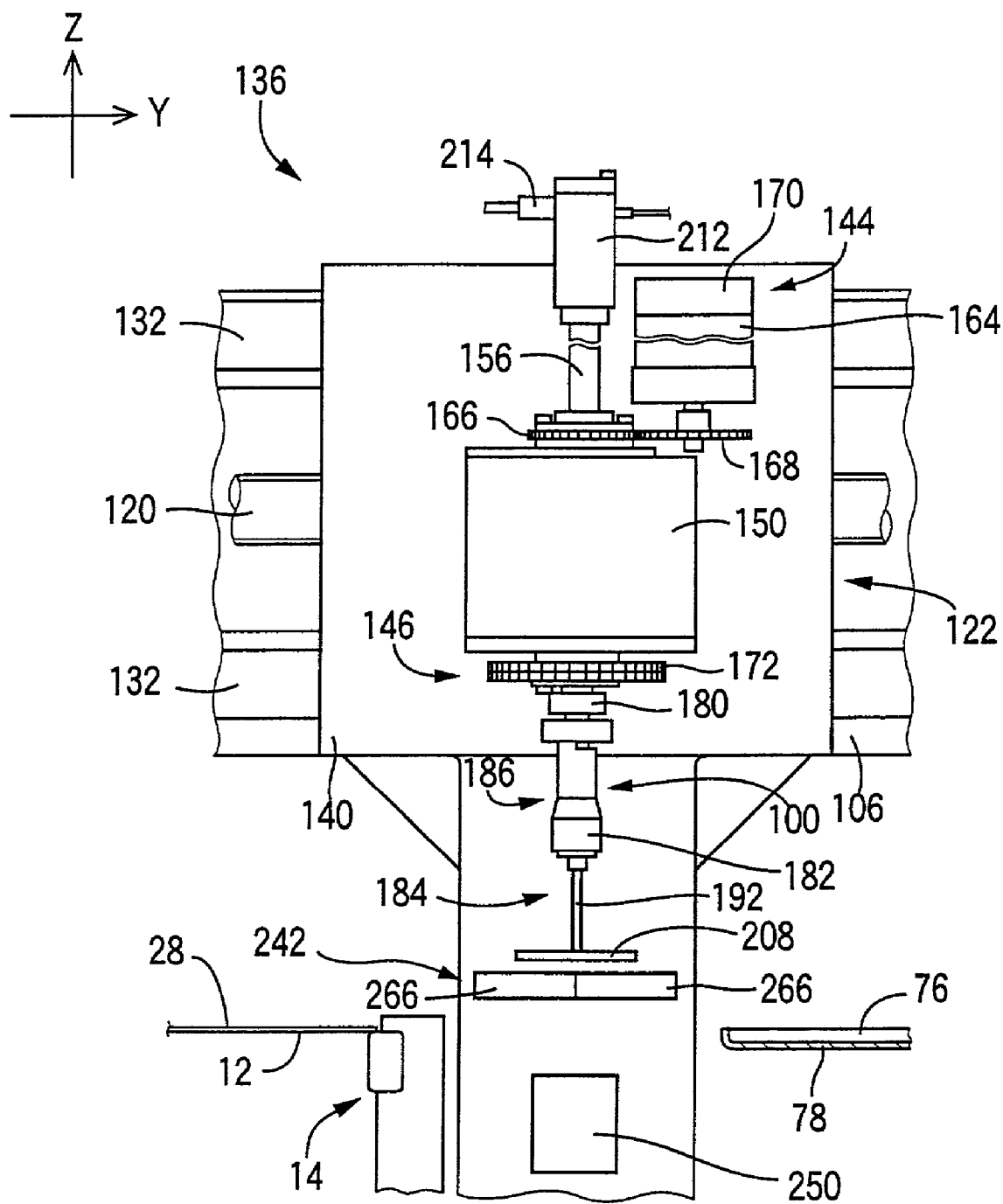
FIG. 3 is a front elevational view showing a component mounting device in the electronic-component mounting system.
Figure 4:
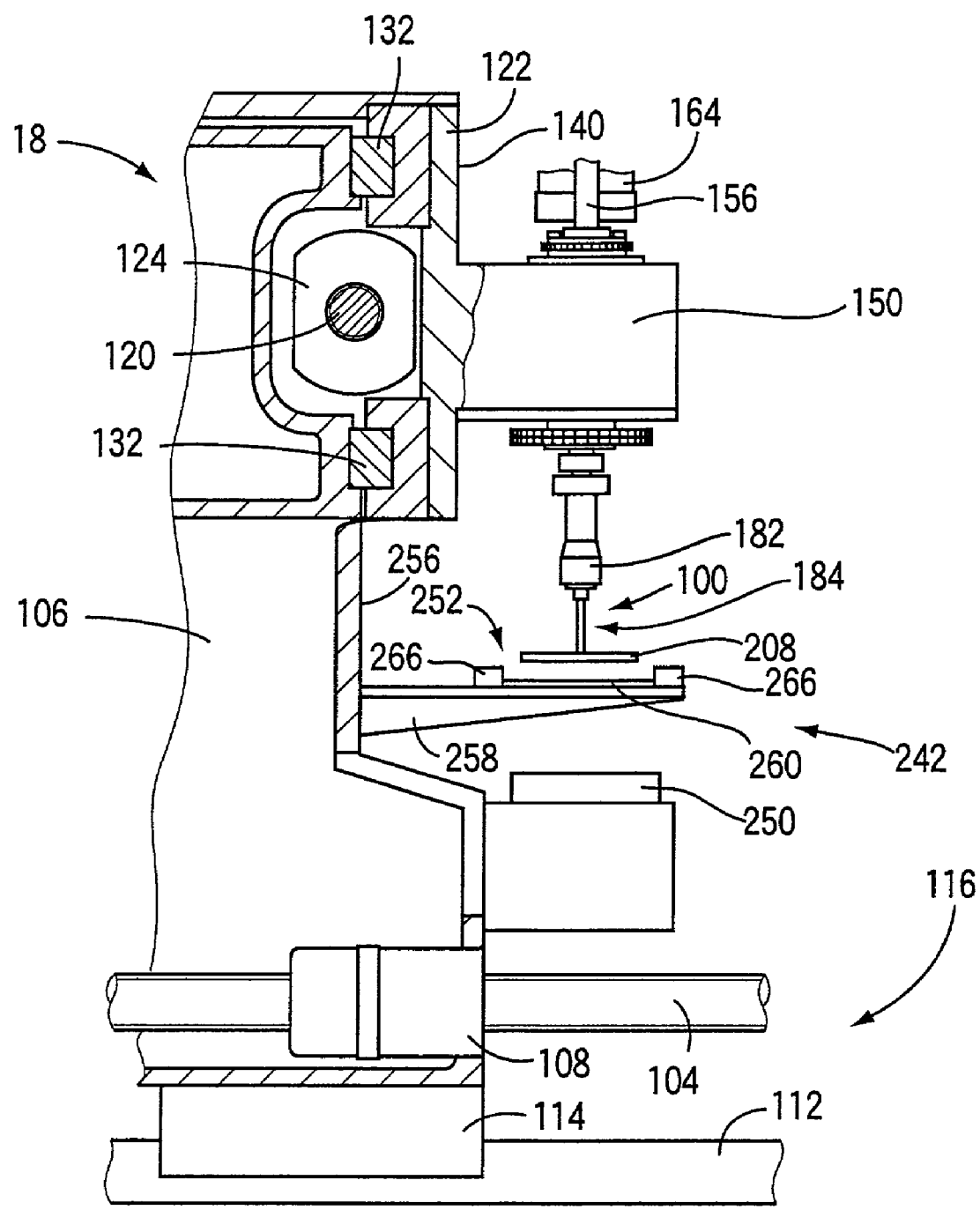
FIG. 4 is a side elevational view, partly in cross section, of the component mounting device of FIG. 3.

The component holding head 100 of the component mounting device 18 is, shown in FIG. 3, movable in the mutually perpendicular X-axis and Y-axis directions, so that the component holding head 100 can take a linear movement having X-axis and Y-axis components, to move each electronic component to a desired position on or above the component-mounting surface 28 of the printed-wiring board 12. To move the component holding head 100 in the X-axis direction, the component mounting device 18 includes two ballscrews 104 disposed on the machine base 10, on the opposite sides of the PWB conveyor 14, so as to extend in the X-axis direction, as shown in FIG. 1, and an X-axis slide 106 having two ballnuts 108 (only one of which is shown in FIG. 4) which engage the respective ballscrews 104. The device 18 further includes two X-axis-direction drive motors 110 for rotating the ballscrews 104, for moving the X-axis slide 106 in the X-axis direction. As shown in FIG. 1, the X-axis slide 106 extends in the Y-axis direction across the PWB conveyor 14, and has a length corresponding to the distance between the component supply device 20 of feeder type and the component supply device 22 of tray type. On the machine base 10, there are disposed two guide rails 112 located under the respective ballscrews 104. The X-axis slide 106 has two guide blocks 114 which slideably engage the guide rails 112, for guiding the X-axis slide 106 in the X-axis direction. It will be understood that the ballscrews 104, ballnuts 108 and X-axis drive motors 110 cooperate with each other to constitute an X-axis drive device 116.

On the X-axis slide 106, there is disposed a ballscrew 120 so as to extend in the Y-axis direction, as shown in FIG. 4. The X-axis slide 106 carries a Y-axis slide 122 having a ballnut 124 which engages the ballscrew 120. The ballscrew 120 is rotated by a Y-axis-direction drive motor 126 (FIG. 1) through gears 128, 130, so that the Y-axis slide 122 is moved in the Y-axis direction while being guided by a pair of guide rails 132. It will be understood that the ballscrew 120, ballnut 124 and Y-axis drive motor 126 constitute a Y-axis drive device 134, and that the Y-axis drive device 134 cooperates with the X-axis slide 106, X-axis drive device 116 and Y-axis slide 122, to constitute a head moving device 136 for moving the component holding head 100 to a desired position in the horizontal XY plane parallel to the component-mounting surface 28 of the printed-wiring board 12.

The Y-axis slide 122 has an upright side surface 140 on which there are mounted the above-indicated component holding head 100, a Z-axis drive device 144 for moving up and down the component holding head 100 in a Z-axis direction, and a rotary drive device 146 for rotating the component holding head 100 about its axis. The component holding head 100, the Z-axis drive device 144 and the rotary drive device 146 constitute a component mounting unit. The component mounting device 18 in the present electronic-component mounting system includes the single component mounting unit. However, it is possible to employ a plurality of component mounting units that are disposed on, e.g., the Y-axis slide 122 such that those units are arranged in a row in the Y-axis direction.

Figure 9:
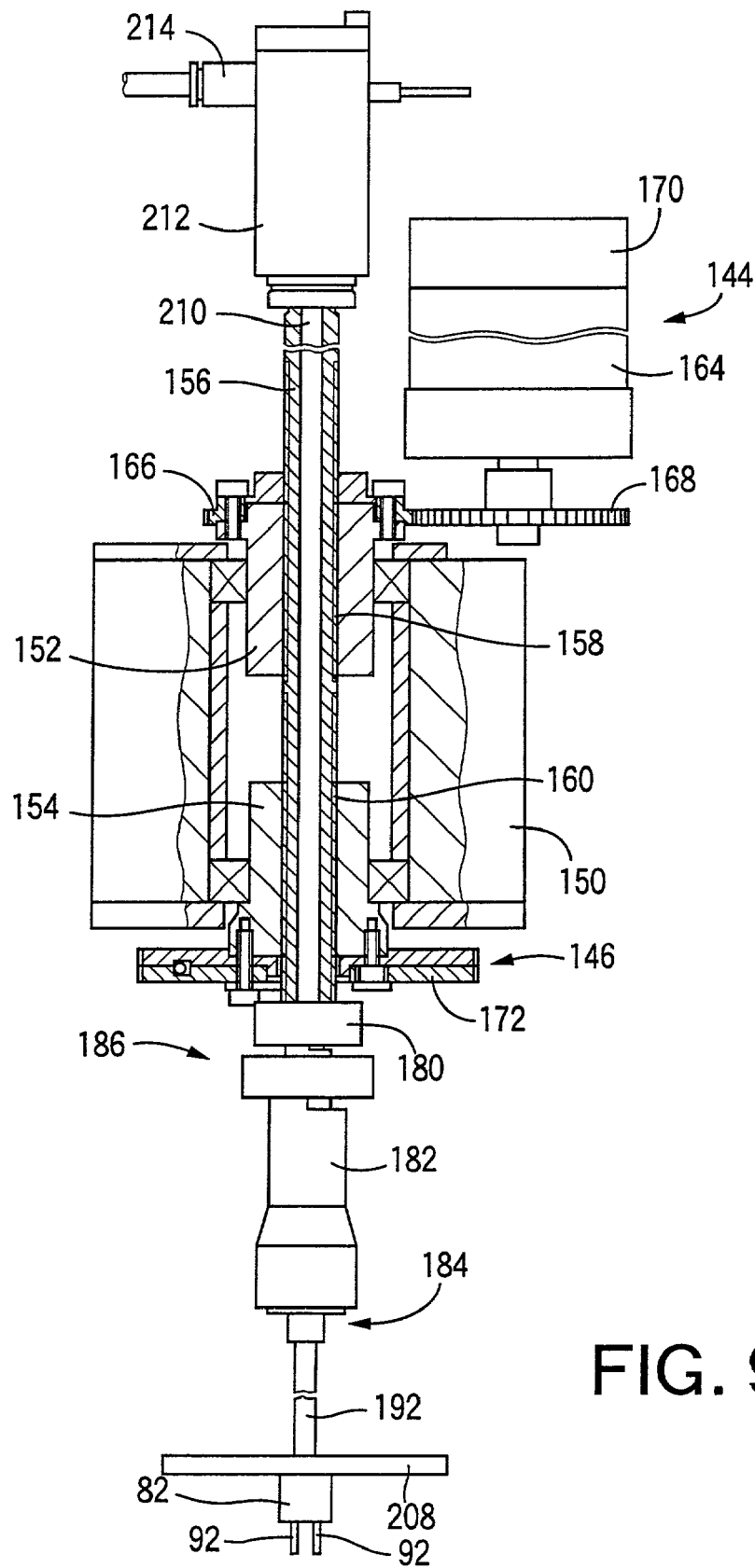
FIG. 9 is a front elevational view, in partly cross section, showing a component holding head, a Z-axis-direction drive device, and a rotating device of the component mounting unit of FIG. 3.

The component mounting unit in the present embodiment is identical with a component mounting unit as disclosed in Japanese patent document No. 5-77186. Accordingly, the component mounting unit will be described only briefly. The Y-axis slide 122 carries a support portion 150 mounted on the side surface 140. As shown in FIG. 9, the support portion 150 supports a nut 152 and a splined member 154 such that the nut 152 and splined member 154 are coaxial with each other, spaced apart from each other in the axial direction, and rotatable about their axis of rotation extending in the vertical or Z-axis direction. The nut 152 engages an externally threaded portion 158 of a hollow rod 156 while the splined member 154 engages a splined portion 160 of the hollow rod 156. The splined portion 160 is formed below the externally threaded portion 158. The nut 152 and splined member 154 are ballnut and ball-splined member which hold a multiplicity of balls.

The nut 152 is rotated by a rotary drive device including a Z-axis-direction drive motor 164 and gears 166, 168, so that the hollow rod 156 is axially moved, that is, lifted and lowered. Thus, the nut 152, gears 166, 168 and Z-axis drive motor 164 constitute the Z-axis drive device 144. The Z-axis drive device 144 arranged to move the hollow rod 156 in the axial direction functions to move the component holding head 100 in the axial direction, that is, in the Z-axis direction perpendicular to the component-mounting surface 28 of the printed-wiring board 12, so that the component holding head 100 is moved toward and away from the printed-wiring board 12. The amount of operation of the Z-axis drive motor 164 is detected by a rotary encoder 170.

Figure 14:
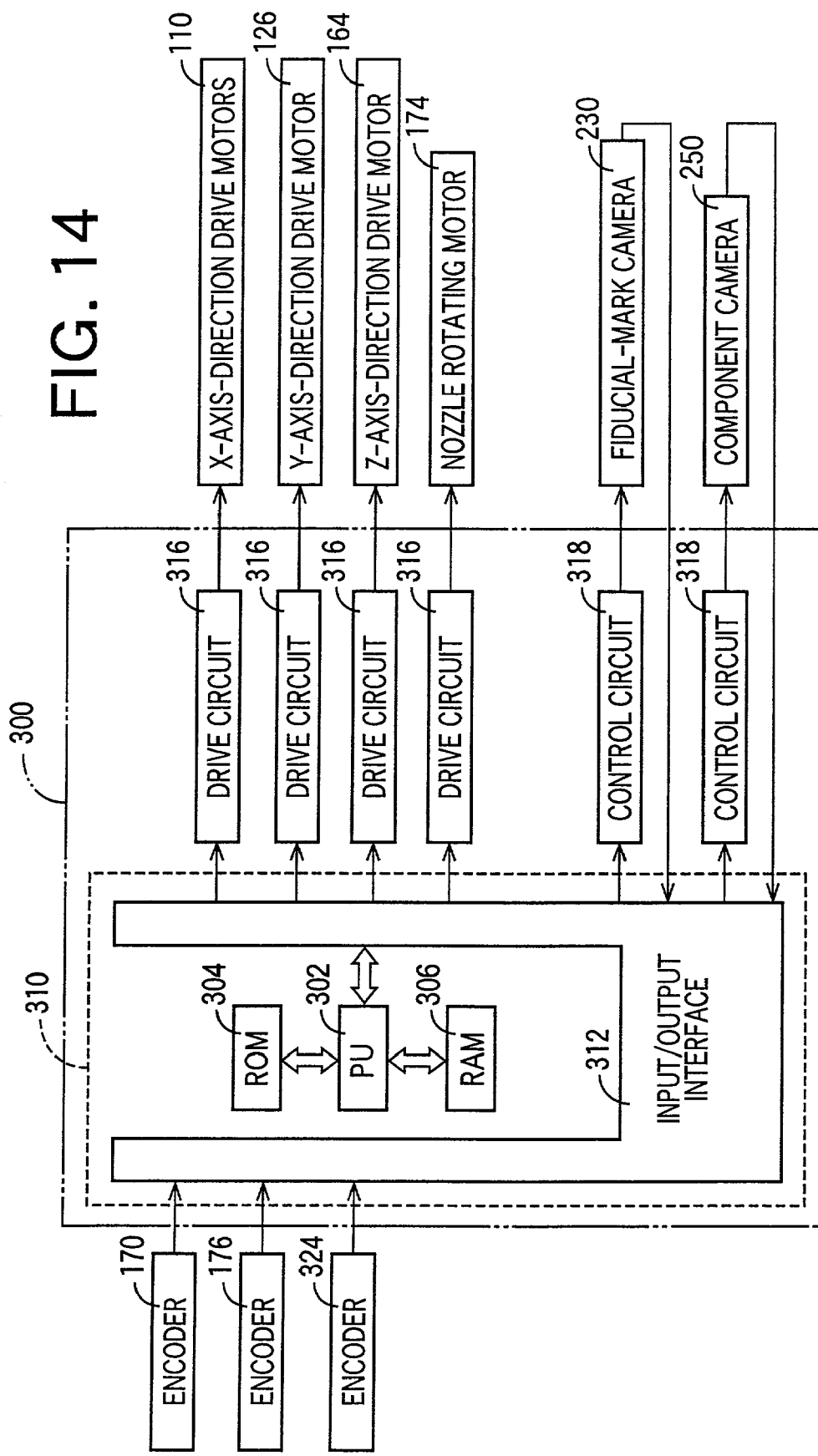
FIG. 14 is a block diagram schematically illustrating a relevant portion of a control device of the electronic-component mounting system.

To the lower end portion of the splined member 154 which projects from the support portion 150, there is fixed a gear 172 which meshes with a gear fixed to the output shaft of a nozzle rotating motor 174 (FIG. 14). The hollow rod 156 is rotated about its axis when the splined member 154 is rotated by the nozzle rotating motor 174. Thus, the component holding head 100 is rotatable about its axis so that the electric component 82 held by the component holding head 100 can be rotated about an axis which extends in the vertical direction perpendicular to the outer surface 84 of the electronic component 82, through an almost central part of the outer surface 84. The amount of operation of the nozzle rotating motor 174 is detected by a rotary encoder 176 (FIG. 14).

Figure 10:
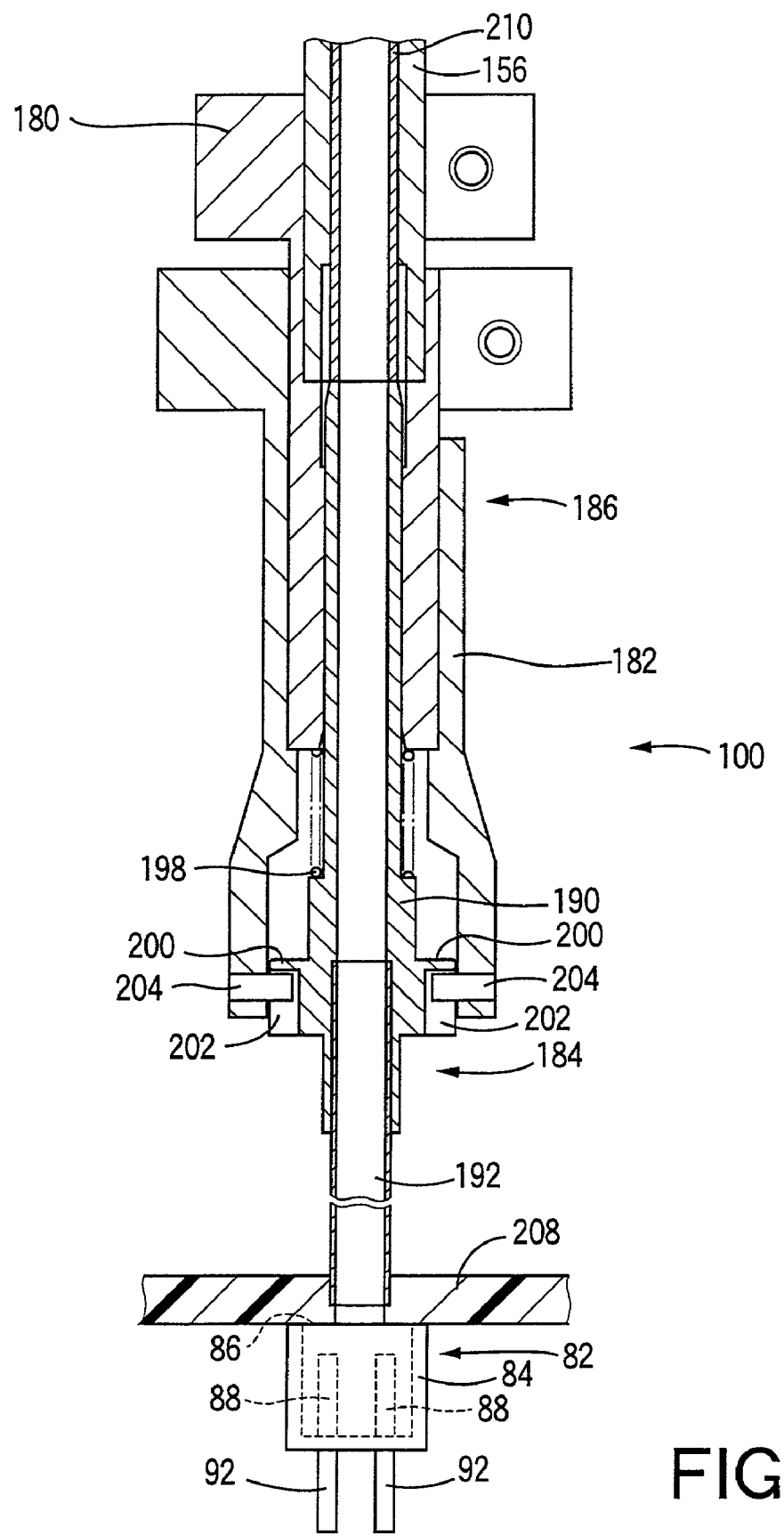
FIG. 10 is a front elevational view, partly in cross section, of the component holding head of FIG. 9.

On the lower end portion of the hollow rod 156, there is removably mounted a chuck adapter 180 on which a chuck 182 is removably mounted, as shown in FIG. 10. The hollow rod 156, chuck adapter 180 and chuck 182 constitute a nozzle holder 186, as a component-holder holder, for removably holding a suction nozzle 184 as a component holder. The nozzle holder 186 and the suction nozzle 184 constitute the component holding head 100.

The suction nozzle 184 has a sleeve 190 and a suction pipe 192 which is partially fitted in the sleeve 190. The sleeve 190 is fitted at its upper portion in the chuck adapter 180 such that the sleeve 190 is biased by a compression coil spring 198 (hereinafter referred to simply as "spring 198") in a direction that causes an exposed lower portion of the sleeve 190 to be moved away from the lower end of the chuck adapter 180. The spring 198 is interposed between the exposed lower portion of the sleeve 190 and the lower end of the chuck adapter 180. The exposed lower portion of the sleeve 190 has a pair of radially extending lugs 200, which are opposite to each other in a diametric direction of the sleeve 190 and which has a pair of slant surfaces 202 lying in the same plane. The chuck 182 has a pair of pins 204 which engage the respective slant surfaces 202, so that the suction nozzle 184 is held by the chuck 182 such that the suction nozzle 184 is not axially movable and not rotatable relative to the chuck 182. The spring 198 serves as a biasing device in the form of an elastic member.

A lower end portion of the suction pipe 192 that projects from the sleeve 190 supports a cover member 208 attached thereto. The cover member 208 has a square shape larger than an electronic component, such as a connector 82, to be held by the suction nozzle 184, and is formed of a hard synthetic resin.

The suction nozzle 184 holds the connector 82 by applying suction or negative pressure thereto, and mounts the connector 82 on the printed-wiring board 12 as the circuit substrate. To this end, the suction nozzle 184 is connected to a negative-pressure source, a positive-pressure source, and an atmosphere, all not shown, via a pipe 210, a housing 212, and a nipple 214. The pipe 210 is fitted in the hollow rod 156 such that the pipe 210 is movable relative to the rod 156 in an axial direction of the rod 156. The housing 212 is fixed to an upper end portion of the pipe 210 that projects out of the hollow rod 156. The nipple 214 is attached to the housing 212. Owing to a switching operation of a solenoid-operated direction control valve (not shown), the suction pipe 192 is selectively communicated with the negative-pressure source, the positive-pressure source, or the atmosphere.

Various sorts of electronic components, such as a flat-package component, in addition to the connector 82 are mounted on the printed-wiring board 12. Various sorts of suction nozzles corresponding to those sorts of electronic components, respectively, are used to mount the components on the board 12. To this end, different sorts of suction nozzles (not shown), such as a suction nozzle including not the cover member 208 but an illuminating body, are prepared, and are stored by a nozzle storing device (not shown). Like the suction nozzle 184, each sort of suction nozzle is detachably attached to the nozzle holder 186, so that the current sort of suction nozzle can be exchanged with another sort of suction nozzle corresponding to another sort of electronic components to be mounted next.

The Y-axis slide 122 further carries a stationary image-taking device in the form of a fiducial mark camera 230 operable to take an image of each of fiducial marks provided on the printed-wiring board 12, as shown in FIG. 1. In the present embodiment, the fiducial mark camera 230 is a CCD camera including CCDs (charge-coupled devices) and a lens system and capable of taking, at once, a two-dimensional image of an object. An illuminating device 232 is provided to illuminate each fiducial mark on the board 12, and its vicinity, when the image of the fiducial mark is taken by the fiducial mark camera 230.

The X-axis slide 106 is provided, as shown in FIGS. 1 and 2, with two stationary image-taking systems 240, 242 which are disposed at respective Y-axis positions at which the respective two ballscrews 104 are disposed. Namely, one 240 of the two image-taking systems 240, 242 is located between the component supply device 20 of feeder type and the PWB conveyor 14 (or the printed-wiring board 12 placed thereon), while the other image-taking system 242 is located between the component supply device 22 of tray type and the PWB conveyor 14.

The first image-taking system 240 has a construction identical with that of an image taking device disclosed in U.S. patent application Ser. No. 09/721,953 assigned to the assignee of the present application. In short, the image-taking system 240 includes a CCD camera (not shown) provided on the X-axis slide 106, and a light guide (not shown) which guides an image-forming light to form an image of an electronic component, to the CCD camera. The image-taking system 240 takes a projected image or a reflected image of an electronic component. Since this image-taking system 240 is not relevant to the present invention, no further description thereof is provided.

Figure 11:
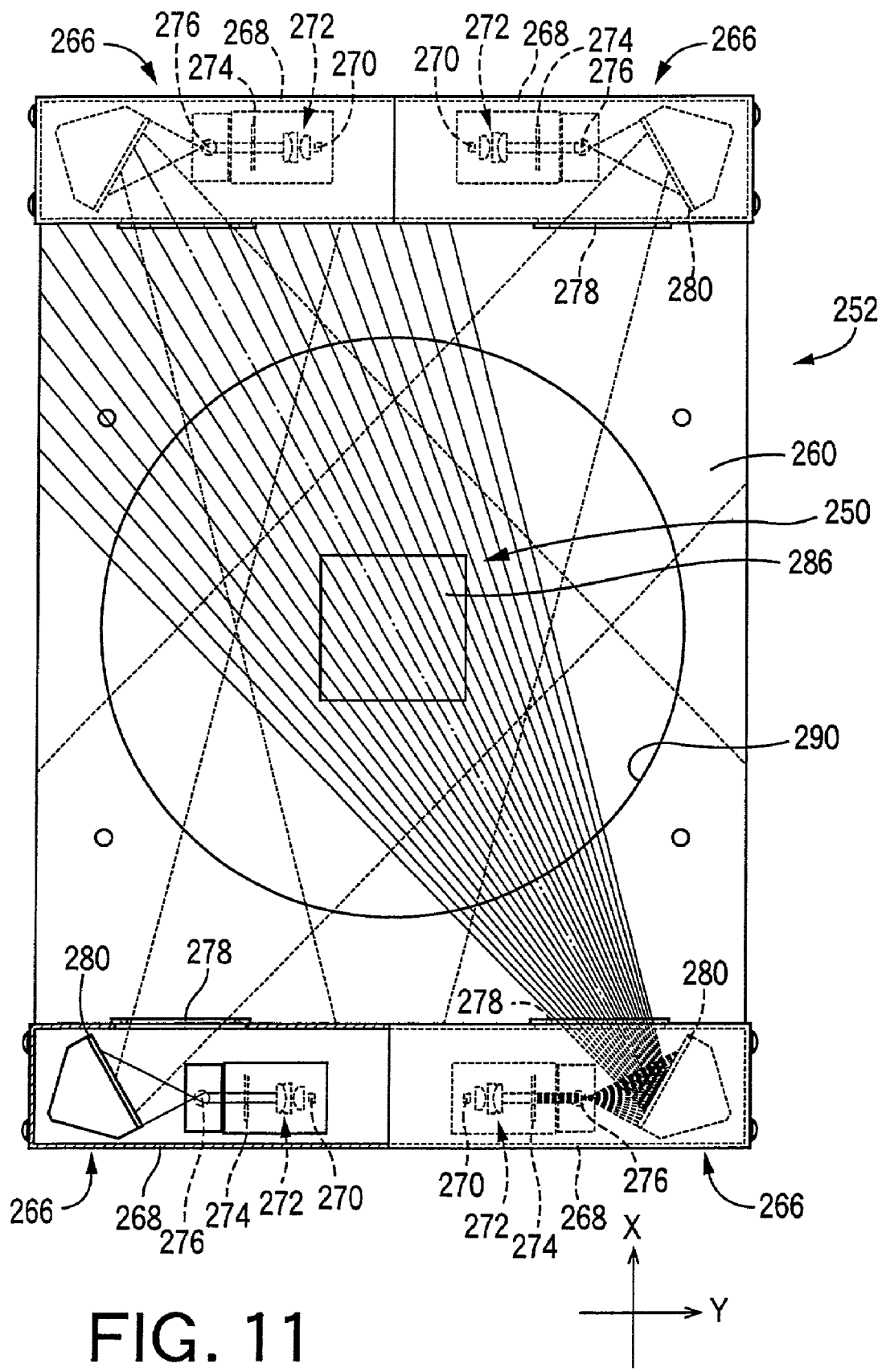
FIG. 11 is a plan view, partly in cross section, showing a locally illuminating device of the lead-position detecting device.

The second image-taking system 242 is located, on the X-axis slide 106, at a position corresponding to the other ball screw 104 between the component supply device 22 of tray type and the PWB conveyor 14. As shown in FIG. 4, the image-taking system 242 includes a component camera 250 as an image-taking device, and a locally illuminating device 252. The local-illumination device 252 is attached to a support plate 260 as a support member that is attached to a bracket 258 projecting from a vertical side surface 256 of the X-axis slide 106. The local-illumination device 252 includes, as shown in FIG. 11, a plurality of (e.g., four) projectors 266 which are provided below a locus of movement of the component holding head 100 on the X-axis slide 106 in the Y-axis direction. Since respective constructions of the projectors 266 are identical with one another, one projector 266 will be described in detail below.

The projector 266 includes a casing 268; a laser diode 270 as a light source that is provided in the casing 268; a groups of lenses 272 that cooperate with each other to convert a laser light emitted from the laser diode 270, into parallel rays; a slit member 274 that has a slit which allows passing of a portion of the parallel rays and thereby provides a "slit" light having a rectangular cross section; a rod lens 276 that diffuses the slit light without changing a thickness of the slit light (as measured in a direction parallel to the lengthwise direction of each straight lead 92, i.e., an axis line about which the component holding head 100 is rotated); and a total-reflection mirror 280 that reflects the light diffused by the rod lens 276 and irradiates the reflected light outward through an outlet 278 formed in the casing 268.

Figure 12:
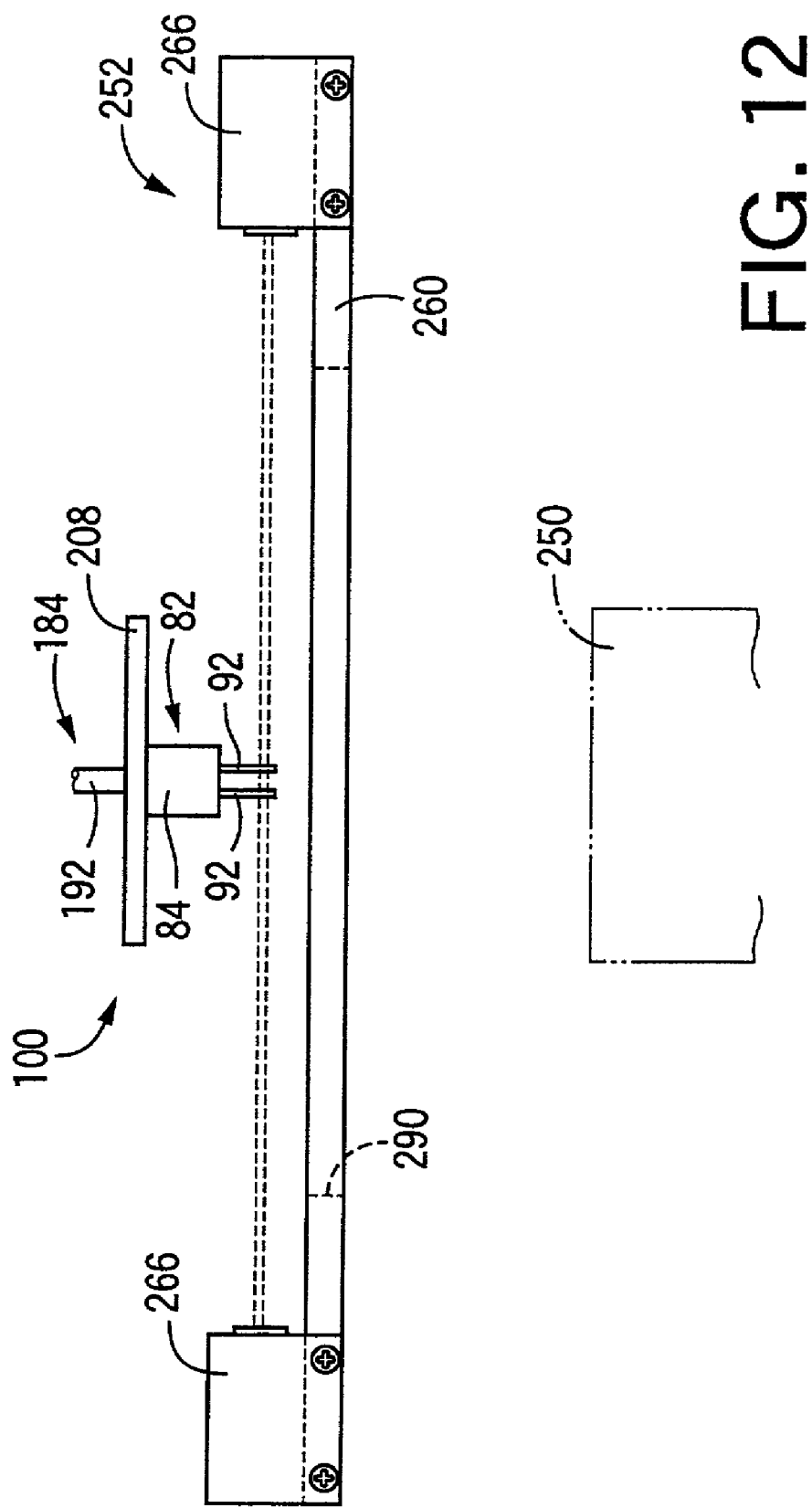
FIG. 12 is a front elevational view of the local-illumination device of FIG. 11.

The four projectors 266 are provided, as shown in FIGS. 11 and 12, on both sides of the locus of movement of the suction nozzle 184 in the Y-axis direction, such that two projectors 266 of the four are arranged in one row on one side of the locus and the other two projectors 266 are arranged in another row on the other side. In other words, two projectors 266 of the four are opposed to each other, and the other two projectors 266 are also opposed to each other, at respective positions offset from the locus of Y-axis-direction movement of the suction nozzle 184, on both sides of the locus. The light irradiated by each of the four projectors 266 has a rectangular cross section, and is a planar light that is parallel to a horizontal plane, as indicated at broken line in FIG. 12, and has a constant thickness (as measured in a vertical direction). The four total-reflection mirrors 280 are so oriented that the respective lights irradiated by the four projectors 266 intersect, as shown in FIG. 11, one another at a central portion of a space that is surrounded by the four projectors 266 and is positioned below the suction nozzle 184 moving on the X-axis slide 106.

Figure 13:
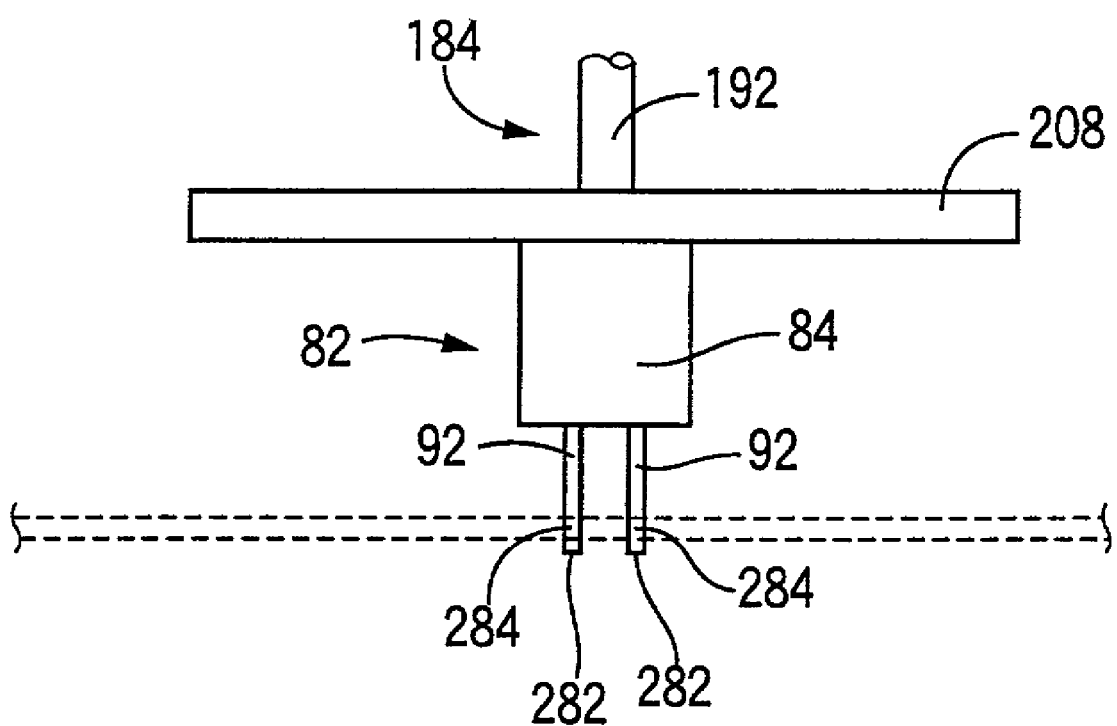
FIG. 13 is a front elevational view showing a state in which the leads of the connector held by the component holding head is exposed to lights irradiated by the local-illumination device.

The thickness of the light irradiated by each of the four projectors 266 is so selected that the light exposes only a limited portion 284 (FIG. 13) of each straight lead 92 as seen in the lengthwise direction thereof. In the present embodiment, as shown in FIG. 13, the limited portion 284 is distant by a prescribed distance from a free-end surface 282 of the lead 92 in a direction toward a base end of the same 92. More specifically described, the limited portion 284 is defined by, and between, a free-end-side position that is distant from the free-end surface 282 by a distance equal to one tenth of a length of the lead 92, and a base-end-side position that is distant from the free-end-side position in a direction toward the base end of the lead 92 by a distance equal to one seventh of the length of the lead 92.

The support plate 260 supporting the local-illumination device 252 can be moved by an adjusting device (not shown) to adjust a position of the plate 260 in a vertical direction that is parallel to the axis of rotation of the component holding head 100, i.e., parallel to the lengthwise direction of each straight lead 92 of the connector 82 held by the head 100. Thus, the vertical-direction position of the plate 260 is so adjusted that the planar light irradiated by each projector 266 just exposes the limited portion 284 having the above-indicated prescribed position, in a direction perpendicular to the lengthwise direction of the lead 92. Thus, in the present embodiment, each lead 92 is exposed to the four lights that are incident thereto in four directions contained in a plane perpendicular to the lengthwise direction of the lead 92.

As shown in FIG. 4, the component camera 250 is located, on the X-axis slide 106, below the local-illumination device 252. In the present embodiment, like the fiducial-mark camera 230, the component camera 250 is provided by a CCD camera including CCDs and a lens system and capable of taking, at once, a two-dimensional image of an object. The CCDs of the CCD camera 250 provide a number of small-size light-detecting elements that are arranged to define an image-forming surface 286 (FIG. 11), and produce respective electric signals representing respective amounts of light detected thereby. The component camera 250 is so located that the image-forming surface 286 is positioned right below the locus of Y-axis-direction movement of the component holding head 100 on the X-axis slide 106 and below an area where the respective lights produced by the four projectors 266 intersect one another. An optical axis of the component camera 250 is vertical and therefore is parallel to the axis of rotation of the component holding head 100, and the image-forming surface 286 is horizontal and faces upward.

The support plate 260 supporting the local-illumination device 252 has a through-hole 290 that is formed, in a vertical direction, through a thickness of a central portion of the plate 260 where the respective lights produced by the four projectors 266 intersect one another. Thus, the image-forming light to form an image of a lead 92 is incident to the image-forming surface 286 of the component camera 250. The bracket 258 supporting the support plate 260 may be arranged to either have a through-hole aligned with the through-hole 290 of the plate 260, or support the plate 260 at respective positions offset from the through-hole 290, so that the image-forming light is allowed to be incident to the image-forming surface 286 of the component camera 250.

The present electronic-component mounting system is provided with a control device 300 illustrated in FIG. 14. The control device 300 is principally constituted by a computer 310 incorporating a processing unit (PU) 302, a read-only memory (ROM) 304, a random-access memory (RAM) 306, and a bus interconnecting those elements 302, 304, 306. The bus is connected to an input/output interface 312 to which various detecting devices, such as the encoders 170, 176, 324, are connected.

To the input/output interface 312, are also connected various actuators such as the X-axis-direction drive motors 110, the Y-axis-direction drive motor 126, the Z-axis-direction drive motor 164, and the nozzle rotating motor 174, each via a drive circuit 316. In the present embodiment, those motors 110, 126, 164, 174 are electric servo motors as drive sources. However, those electric motors may be electric rotary motors of other types such as stepping motors, as long as the amounts of operation thereof can be accurately controlled. Electric linear motors may be employed in place of the electric rotary motors. The respective rotation angles of the electric motors 110, 126, 164, 174 are detected by the respective encoders 170, 176, 324, and those electric motors are controlled based on the respective outputs of those encoders.

The input/output interface 312 is also connected to the fiducial-mark camera 230 and the component camera 250, each via a control circuit 318. Also not shown in FIG. 14, the interface 312 is also connected to the CCD camera of the image-taking system 240. The drive circuits 316, the control circuits 318, and the computer 310 cooperate with one another to provide the control device 300. The RAM 306 stores various control programs and data, such as a program and data for mounting one or more electronic components on a printed-wiring board 12, and a program and data for detecting a position of a lead of an electronic component.

Next, there will be described the operation of the suction nozzle 184 for mounting a connector 82 on the printed-wiring board 12.

When the suction nozzle 184 mounts the connector 82, first, the head moving device 136 moves the component holding head 100 to the tray-type component supply device 22, so that the holding head 100 is stopped at a position right above the connector 82 accommodated in one of the component trays 76. Then, the Z-axis drive device 144 lowers the holding head 100, and a negative pressure is supplied to the suction nozzle 184, so that the nozzle 184 holds, by suction, the connector 82.

The connector 82 is accommodated in the component tray 76 such that the opening 86 thereof that will provide the upside thereof when the connector 82 is mounted faces upward. When the suction nozzle 184 is lowered, the suction pipe 192 faces the opening 86, and eventually the cover member 208 contacts the open end of the body 84 of the connector 82. Since the cover member 208 is larger than the opening 86, the opening 86 is substantially airtightly closed by the cover member 208 contacting the open end of the body 84, so that the cover member 208 and the body 84 cooperate with each other to define a vacuum chamber that communicates with the suction pipe 192. Since the negative pressure is supplied to the vacuum chamber, the connector 82 is sucked by the suction pipe 192 and accordingly is held by the component holding head 100.

As the component holding head 100 is elevated, the suction nozzle 184 holding, by suction, the connector 82 is elevated. Then, the head moving device 136 moves the holding head 100 holding the connector 82, to a position above the printed-wiring board 12, along a horizontal plane substantially perpendicular to the lengthwise direction of the leads 92. The component holding head 100 is moved to a prescribed component-mount place on the printed-wiring board 12 where the connector 82 is to be mounted, along a straight line connecting between the component-supply portion of the component tray 76 (i.e., the portion of the tray 76 where the component accommodating recess from which the connector 82 has been taken is located), and the prescribed component-mount place on the board 12. Thus, the holding head 100 is moved to the image-taking system 242 provided on the X-axis slide 106 at the position between the component-supply portion and the component-mount place.

Irrespective of which positions are occupied by the component-supply portion and the component-mount place in the tray-type component supply device 22 and the printed-wiring board 12, the component holding head 100 must move, for moving from the component-supply portion and the component-mount place, on the X-axis slide 106 in the Y-axis direction via a position between the tray-type component supply device 22 and the printed-wiring board 12. Therefore, the holding head 100 must move over the component camera 250 and the local-illumination device 252 provided on the X-axis slide 106 at the respective positions between the component-supply portion and the component-mount place, so that during the movement of the holding head 100, an image of the connector 82 is taken by the component camera 250.

The component holding head 100 is stopped at a prescribed image-taking position (i.e., a prescribed component-posture detecting position) where the axis of rotation of the holding head 100 coincides with the center of the image-forming surface 286 of the component camera 250. In the state in which the holding head 100 is stopped at the image-taking device, the respective lengthwise limited portions 284 of all the leads 92 of the connector 82 are positioned, as shown in FIG. 13, in a space where the respective lights irradiated by the four projectors 266 of the local-illumination device 252 intersect one another.

As previously described, the connector 82 is accommodated in the accommodating recess of the component tray 76 such that the opening 86 of the body 84 thereof faces upward and the leads 92 thereof extend vertically, and is held by the component holding head 100 such that the leads 92 extend vertically downward from the outer or bottom surface 90 of the body 84. Therefore, the respective lights irradiated by the four projectors 266 are incident to the leads 92 in the four directions contained in the horizontal plane perpendicular to the lengthwise direction of each lead 92.

Figure 15:
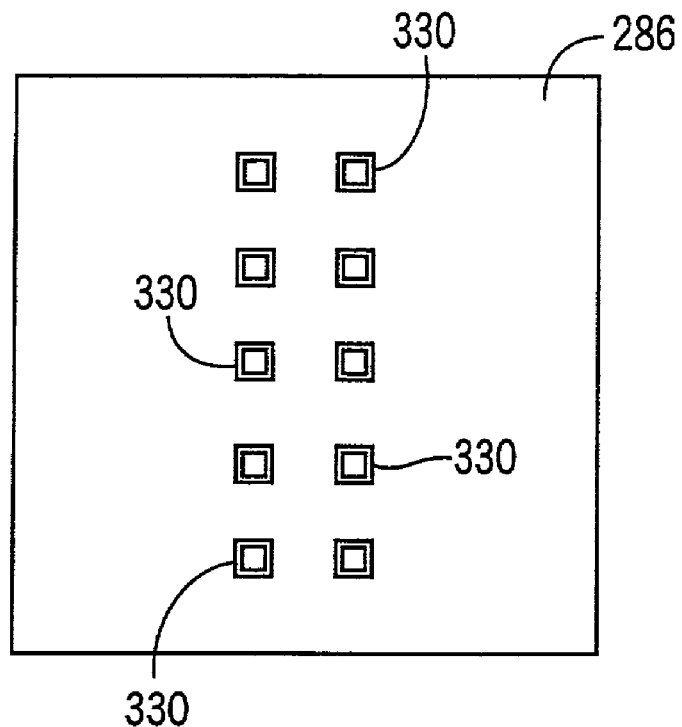
FIG. 15 is a view showing an image of the leads of the connector that is taken by a component camera of the lead-position detecting device.

As previously described, the thickness and position of the light irradiated by each projector 266 are so pre-set as to be incident to only the respective limited portions 284 of the leads 92, i.e., the respective portions of the leads 92 that are distant from the respective free-end surfaces 282 thereof toward the respective base ends thereof by respective small distances. Since each lead 92 is exposed to the respective lights transmitted in the four directions different from one another, an entire circumference of the limited portion 284 of each lead 92, i.e., an annular portion of each lead 92 is illuminated, i.e., reflects the lights. The reflected lights are incident to the image-forming surface 286 of the component camera 250, so that respective images 330 of respective transverse-cross-sectional shapes of the leads 92 are formed on the image-forming surface 286, as schematically illustrated in FIG. 15.

The component camera 250 is provided below the local-illumination device 252 and the locus of movement of the component holding head 100, such that the optical axis of the camera 250 is vertical and the image-forming surface 286 thereof faces upward. Thus, the camera 250 takes the images 330 of the leads 92, extending perpendicularly from the bottom surface 90 of the body 84, on the side of the respective free ends of the leads 92, in a direction parallel to the lengthwise direction of each lead 92. The image 330 of each lead 92 has a square, annular shape corresponding to the transverse-cross-sectional shape of the lead 92. The image 330 is a thin, light, annular line. Since each lead 92 is illuminated with the lights transmitted along the horizontal plane, i.e., in the directions perpendicular to the lengthwise direction of the lead 92, the body 84 is not illuminated with the lights and accordingly only the images 330 of the leads 92 are taken.

Figure 16:
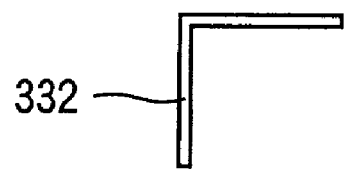
FIG. 16 is a view showing an image of another lead of the connector that is taken by the component camera.

Meanwhile, for example, in the case where one lead 92 is bent, the component camera 250 may take an image 332 of the lead 92, as shown in FIG. 16, depending upon the amount of bending of the lead 92 and/or the distance between the lead 92 and the projectors 266. The taken image 332 is likely to correspond to only a portion of the contour line of the transverse-cross-sectional shape of the lead 92. However, since a nominal transverse-cross-sectional shape and dimensions of each lead 92 are known beforehand to the control device 300, the control device 300 can calculate and estimate, based on those shape and dimension data and the image data representing the taken image 332, an image of the entire contour line of the transverse-cross-sectional shape of the lead 92.

The control device 300 processes image data representing the taken images 330, and determines respective positions of a plurality of (e.g., ten) leads 92. More specifically described, the control device 300 determines, as the respective positions of the leads 92, respective positions of respective centers of the images 330. The respective limited portions 284 of the leads 92 are distant from the respective free ends of the leads 92 toward the respective base ends thereof, each by the prescribed distance. However, the width of each limited portion 284 is small, and the prescribed distance is short. Thus, the position of the limited portion 284 of each lead 92 can be accurately detected. In addition, the position of each lead 92 as the position of the center of the corresponding image 330 is substantially equal to the position of the free end of the lead 92. Then, the control device 300 determines errors of the detected, i.e., actual positions of each lead 92 from reference or correct positions thereof, and judges whether the connector 82 can be mounted on the printed-wiring board 12. If a positive judgment is made, the control device 300 determines correction amounts to correct or modify reference amounts of movement of the component mount head 100 needed to mount the connector 82 on the board 12, and a correction amount to correct or modify a reference angular position of the holding head 100 at which the connector 82 is mounted on the board 12.

Figure 17:
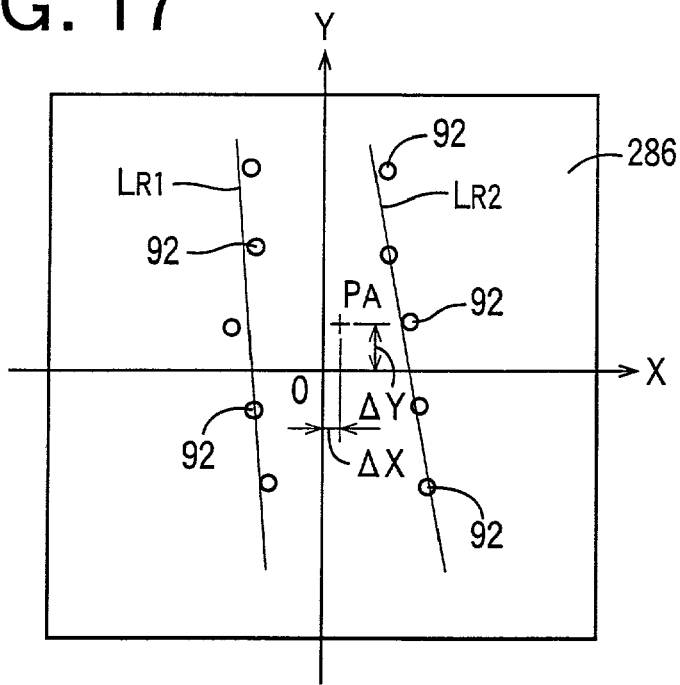
FIG. 17 is a view for explaining a manner in which X-and-Y-direction-positional errors of the leads are determined based on the image of the leads.
Figure 18:
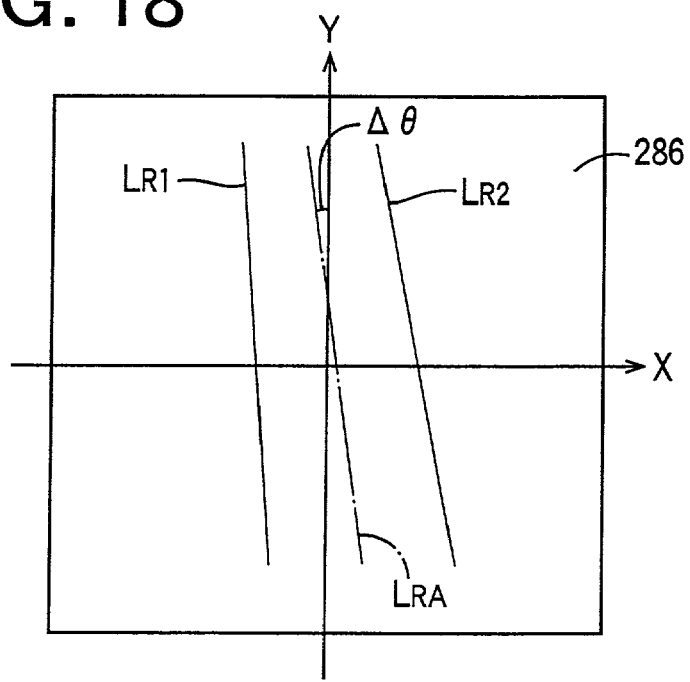
FIG. 18 is a plan view for explaining a manner in which an angular-positional error of the leads is determined.

The above-indicated correction amounts can be determined in various manners. In the present embodiment, those correction amounts are determined in the following manner:

First, as illustrated in FIG. 17, the control device 300 determines, by, e.g., least square, respective regression lines, LR1, LR2, for the two rows of leads 92 of the connector 82. Each regression line is defined such that the sum of respective errors of the respective positions of the leads 92 of the corresponding row from the line is the least. In FIG. 17, white circles represent the respective positions of the leads 92. Second, as illustrated in FIG. 18, the control device 300 determines an average line, LRA, of the two regression lines LR1, LR2. The average regression line LRA is indicated at one-dot chain line. Then, the control device 300 determines a slope, $\Delta\theta$, of the average regression line LRA. Thus, the slope $\Delta\theta$ is obtained based on the respective positions of the leads 92. The slope $\Delta\theta$ indicates an average angular position of the leads 92 of the two rows about a straight line perpendicular to the bottom surface 90 of the connector 82. Here, it is assumed that prescribed control data command the component holding head 100 to hold the connector 82 at an angular position where the direction in which the leads 92 are arranged is parallel to the Y-axis direction. Therefore, the slope $\Delta\theta$ of the average regression line LRA relative to the Y-axis direction indicates an error of the actual angular position of the connector 82 from the Y-axis direction as a reference angular position.

In addition, as illustrated in FIG. 17, the control device 300 determines an average position, PA, of the respective positions of the ten leads 92, by calculating an average value of the respective X coordinates of the leads 92 and an average value of the respective Y coordinates of the leads 92. The average position PA determined based on the ten leads 92 can be regarded as a position of the center of the connector 82. Then, the control device 300 determines respective errors, $\Delta X$, $\Delta Y$, of the average position PA from a reference (or correct) position of the center of the connector 82. The position of the component holding head 100 is defined as the position of the axis of rotation thereof. When an image-taking operation is carried out, the holding head 100 is stopped at the image-taking position such that the axis of rotation of the head 100 coincides with a center, O, of the image-forming surface 286 of the component camera 250. Accordingly, in the present embodiment, the reference or correct position of the center of the connector 82 is the center O of the image-forming surface 286.

Moreover, the control device 300 determines respective positions that will be taken by the ten leads 92 of the connector 82 if the component holding head 100 is moved so that the center of the connector 82, determined based on the respective positions of the ten leads 92, coincides with the reference center thereof and if the holding head 100 is rotated to eliminate the error of the angular position of the connector 82. In addition, the control device 300 determines respective differences of the thus determined positions of the leads 92 from respective reference (or correct) positions thereof that are prescribed relative to the reference center of the connector 82. More specifically described, the control device 300 determines, for each of the leads 92, an X-axis-direction difference and a Y-axis-direction difference of the determined position of the each lead 92 from the reference position thereof. Then, the control device 300 compares an absolute value of each of the X-axis-direction difference and the Y-axis-direction difference determined for each of the leads 92, with a reference value, and judges that all the leads 92 can be inserted in the insertion holes 96, if the absolute value of each of the X-axis-direction and the Y-axis-direction differences determined for each of the leads 92, is smaller than the reference value.

Thus, when the component holding head 100 is moved to the position right above the prescribed component-mount place on the printed-wiring board 12, the reference amounts of movement of the holding head 100 are corrected or modified by the errors $\Delta X$, $\Delta Y$, and the angular position of the holding head 100 is corrected or modified by the error $\Delta\theta$. The holding head 100 is rotated by the rotating device 146 by the error $\Delta\theta$. After the holding head 100 is moved to the position right above the prescribed component-mount place, the holding head 100 is lowered, so that the suction nozzle 184 is lowered and all the leads 92 of the connector 82 are inserted in the insertion holes 96 of the printed-wiring board 12. Thus, the connector 82 is mounted on the board 12. The positional errors of the leads 92 result from various reasons, such as the positional error of the connector 82 relative to the holding head 100, the positional errors of the leads 92 relative to the body 84, and/or respective bendings of the leads 92. However, since the reference amounts of movement of the holding head 100 and the angular position of the holding head 100 are modified, i.e., since the positions of the holding head 100 relative to the board 12 are modified, the connector 82 can be safely mounted on the board 12. The leads 92 inserted in the holes 96 of the board 12 are soldered to the board 12 in a subsequent step.

The foregoing description has been made, for easier understanding purposes only, on an assumption that the printed-wiring board 12 is supported by the board supporting device without any positional errors. In fact, however, when the connector 82 is mounted on the board 12, respective X-axis-direction and Y-axis-direction errors of the insertion holes 96 resulting from the positional errors of the board 12 relative to the board supporting device, are determined, and those positional errors are also eliminated by modifying the reference amounts of movement of the holding head 100 and rotating the holding head 100. Thus, the leads 92 can be safely inserted in the holes 96. The positional errors of the insertion holes 96 may be determined as follows; First, the fiducial-mark camera 230 is operated to take respective images of the fiducial marks affixed to the printed-wiring board 12, subsequently positional errors of the board 12 are determined based on the thus taken images, and then the positional errors of the holes 96 are determined based on the thus determined positional errors of the board 12. Since usually the respective positions of the holes 96 relative to one another are highly accurate, it can be assumed that there is no positional errors of the holes 96 relative to one another. Thus, the respective positional errors of the holes 96 can be determined based on the positional errors of the board 12. More specifically described, respective X-axis-direction and Y-axis-direction errors of a center of a certain group of insertion holes 96 (e.g., ten holes 96), and a slope or angle of the row or rows of holes 96 relative to the Y-axis direction are calculated, and those positional errors of the holes 96 are also eliminated by modifying the reference amounts of movement of the component holding head 100 and rotating the holding head 100.

On the other hand, if at least one of the respective absolute values of respective differences between the actual X-axis-direction and Y-axis-direction positions of the leads 92 and the reference or correct positions of the same 92 is greater than the reference value, the control device 300 judges that the connector 82 cannot be mounted on the board 12 and operates the holding head 100 to discard the connector 82 into a discarding device, not shown.

Figure 19:
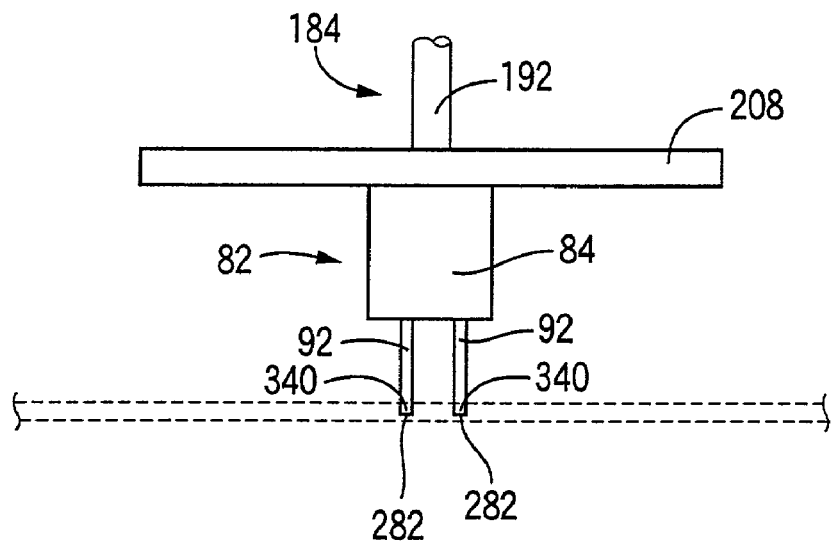
FIG. 19 is a view showing a state in which leads are exposed to lights irradiated by the local-illumination device in another lead-positional-error determining manner carried out by the lead-position detecting device.

The local-illumination device 252 may be so adjusted as to illuminate the free end of each of the leads 92 and a portion of the each lead 92 that is adjacent to the free end, as illustrated in FIG. 19. More specifically described, the position of the illumination device 252 in the vertical direction parallel to the axis of rotation of the component holding head 100 and the lengthwise direction of each lead 92, may be so adjusted that the lights reflected by the respective total-reflection mirrors 280 of the projectors 266 are incident to a limited portion 340 of the each lead 92 that is located between, and defined by, a free-end surface 282 of the each lead 92 and a position distant from the surface 282 by a prescribed distance (in the present embodiment, one tenth of the length of the each lead 92).

Figure 20:
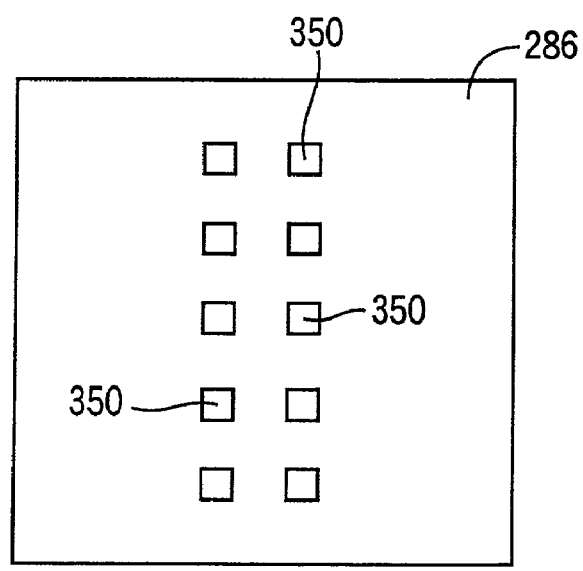
FIG. 20 is a view showing an image of the leads that is taken in the lead-positional-error determining manner shown in FIG. 19.

In the above-indicated modified mode, after the component holding head 100 holds, by suction, the connector 82, the holding head 100 is moved toward the printed-wiring board 12 and, during the movement of the holding head 100, the holding head 100 is stopped at the position right above the image-taking system 242. In this state, the respective limited portions 340 of the leads 92 that include the respective free-end surfaces 282 are positioned in the respective lights irradiated by the four projectors 266, so that the respective outer circumferential surfaces and respective free-end surfaces 282 of the leads 92 are illuminated. Consequently the outer circumferential surface and free-end surface 282 of each of the leads 92 reflect the lights and form, on the image-forming surface 286 of the component camera 250, an image 350 of a square transverse-cross-sectional shape of the each lead 92, as shown in FIG. 20. Since not only the outer circumferential surface of each lead 92 but also the free-end surface 282 of the each lead 92 are illuminated, a greater amount of light is reflected by the each lead 92. In addition, since the contour line of the image 350 is formed by the light incident to the outer circumferential surface of the each lead 92, the contour line of the image 350 represents an accurate contour line of the transverse-cross-sectional shape of the each lead 92. Based on the thus obtained images 350 of the leads 92, the control device 300 determines respective positions of the leads 92 in the same manner as the above-described manner in which the respective positions of the leads 92 are determined based on the respective images 330 thereof obtained by illuminating the respective limited portions 284 thereof distant from the respective free ends thereof.

As is apparent from the foregoing description of the illustrated embodiment, a portion of the control device 300 that processes the image data representing the image of the connector 82 taken by the component camera 250 and thereby determines the respective positions of the leads 92, provides an image processing device.

In the illustrated embodiment, the control device 300 determines respective errors of the respective actual positions of the plurality of leads 92 from the respective reference or correct positions thereof, and judges that the connector 82 cannot be mounted on the printed-wiring board 12 if at least one of the respective absolute values of those errors is greater than the reference value. However, the control device 300 may be so modified as to additionally judge whether the respective errors of the respective actual positions of the leads 92 can be so compensated for by the respective areas of the insertion holes 96 that all the leads 92 can be safely inserted in the holes 96. If a positive judgment is made, the control device 300 determines correction amounts needed to correct or modify the reference amounts of movement of the component holding head 100, and a correction amount needed to correct or modify the angular position of the holding head 100. Since the transverse-cross-sectional transverse cross-sectional area of each hole 96 is larger than that of each lead 92, respective differences between the respective areas of the holes 96 and the respective areas of the leads 92 may compensate for the respective errors of the respective actual positions of the leads 92, thereby allowing the leads 92 to be inserted in the holes 96.

The control device 300 judges whether the leads 92 of the connector 82 can be inserted in the insertion holes 96 of the printed-wiring board 12, based on the respective amounts, and directions, of the respective errors of the actual positions of the leads 92. For example, in the case where two leads 92 that should have a same position in the Y-axis direction have respective actual positions shown in FIG. 21A, i.e., the two leads 92 are excessively near to each other in the X-axis direction, even if one of the two leads 92 may be inserted in a corresponding hole 96, the other lead 92 cannot be inserted in a corresponding hole 96. Thus, in this case, it is impossible to modify the reference amounts of movement of the holding head 100, or change the angular position of the head 100, so as to assure that all the leads 92 are inserted in the holes 96, respectively. In addition, in the case where two leads 92 that should have a same position in the Y-axis direction have respective actual positions shown in FIG. 21B, i.e., the two leads 92 are excessively distant from each other in the X-axis direction, it is impossible to assure that all the leads 92 are inserted in the holes 96. In the case where two leads 92 that should have a same position in the X-axis direction have respective actual positions shown in FIG. 21C or 21D, i.e., the two leads 92 are excessively near to, or distant from, each other in the Y-axis direction, it is also impossible to assure that all the leads 92 are inserted in the holes 96. In contrast, in the case where two or more leads have respective angular-positional errors but those angular-positional errors have a same direction about an axis line of the connector 82, as shown in FIG. 21E, it is possible to rotate the connector 82 about the axis line thereof and thereby assure that all the leads 92 are inserted in the holes 96. In the last case, the control device 300 calculates a correction angle by which the connector 82 is rotated to assure the insertion of the leads 92. In this case, too, the control device 300 detects respective positional errors of the holes 96 resulting from the positional errors of the printed-wiring board 12, and those positional errors of the holes 96 are compensated for by modifying the reference amounts of movement of the holding head 100 and/or changing the angular position of the head 100, when the connector 82 is mounted on the board 12. In FIGS. 21A to 21E, each of the respective cross-sectional shapes of the leads 92 is represented by a circle, for easier illustration purposes only.

In the illustrated embodiment, the local-illumination device 252 employs the laser diodes 270 as the light sources thereof However, it is possible to employ a local-illumination device that employs a light emitting diode as a light source thereof, as will be described below by reference to FIGS. 22 to 28.

Figure 22:
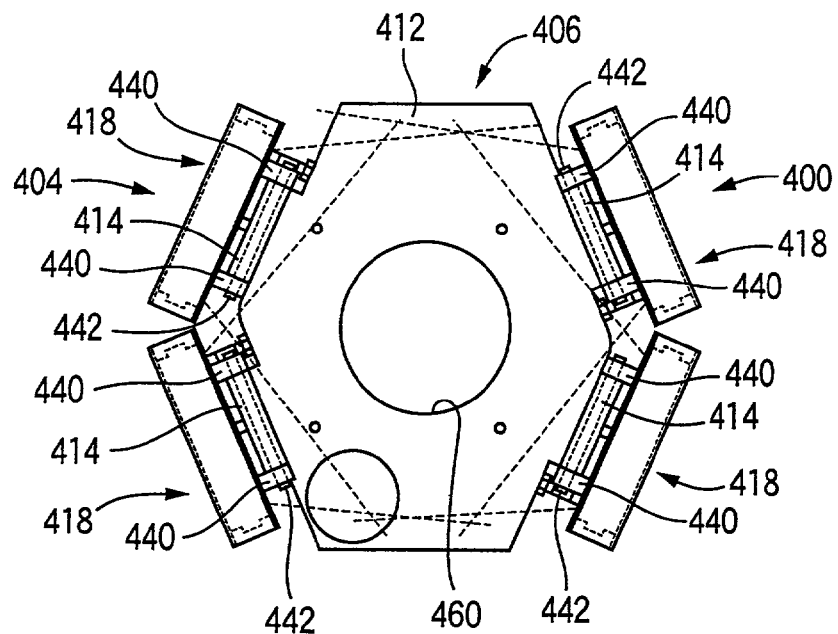
FIG. 22 is a plan view showing another lead-position detecting device as another embodiment of the present invention.

FIG. 22 shows an image-taking system 400 including a component camera 402 as an image-taking device, and a local-illumination device 404. Like the image-taking system 242, the image-taking system 400 may be attached to the X-axis slide 106 of the head moving device 136, shown in FIG. 3, via a support member 406 and a bracket, not shown.

Figure 23:
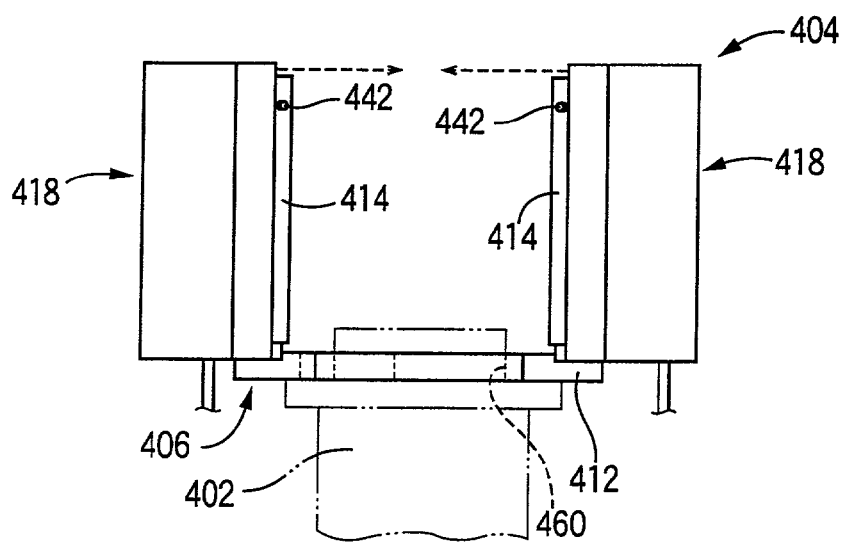
FIG. 23 is a front elevational view of the lead-position detecting device of FIG. 22.
Figure 24:
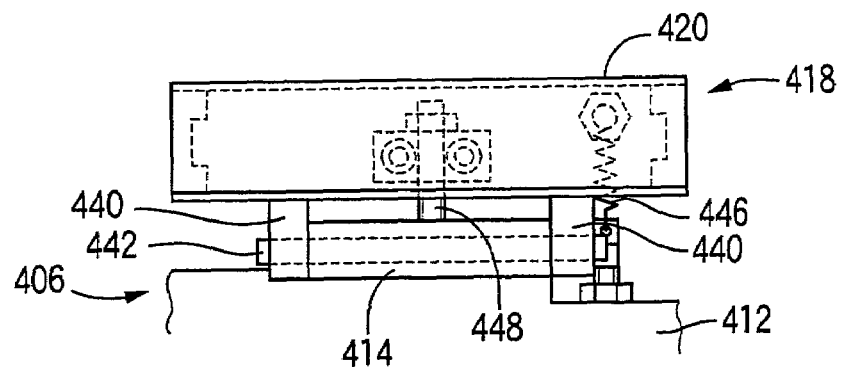
FIG. 24 is a plan view showing a projector in a local-illumination device of the lead-position detecting device of FIG. 22.
Figure 25:
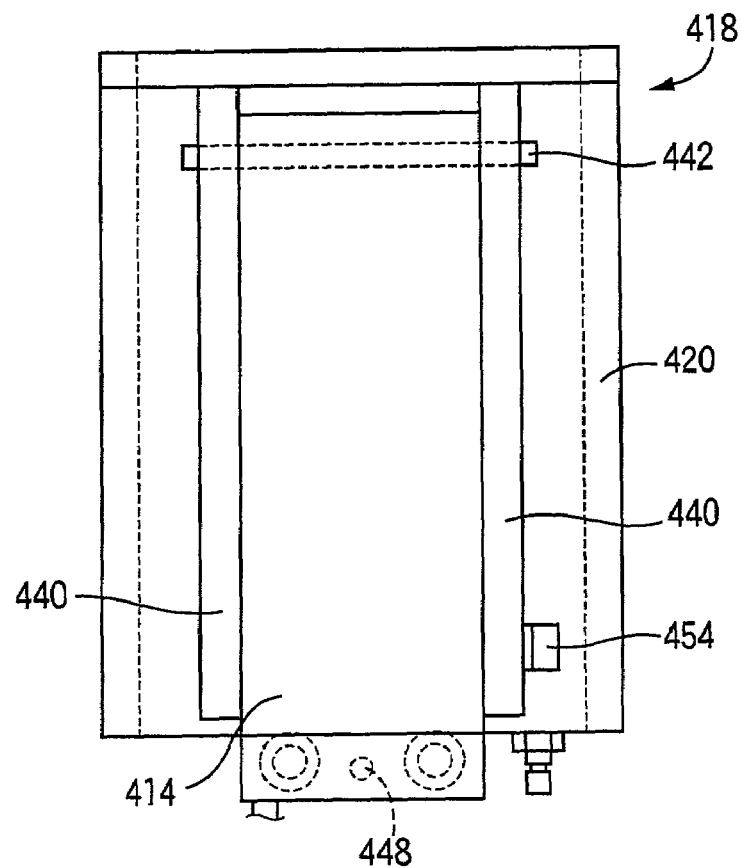
FIG. 25 is a front elevational view showing a state in which the projector of FIG. 24 is supported by a support member.
Figure 26:
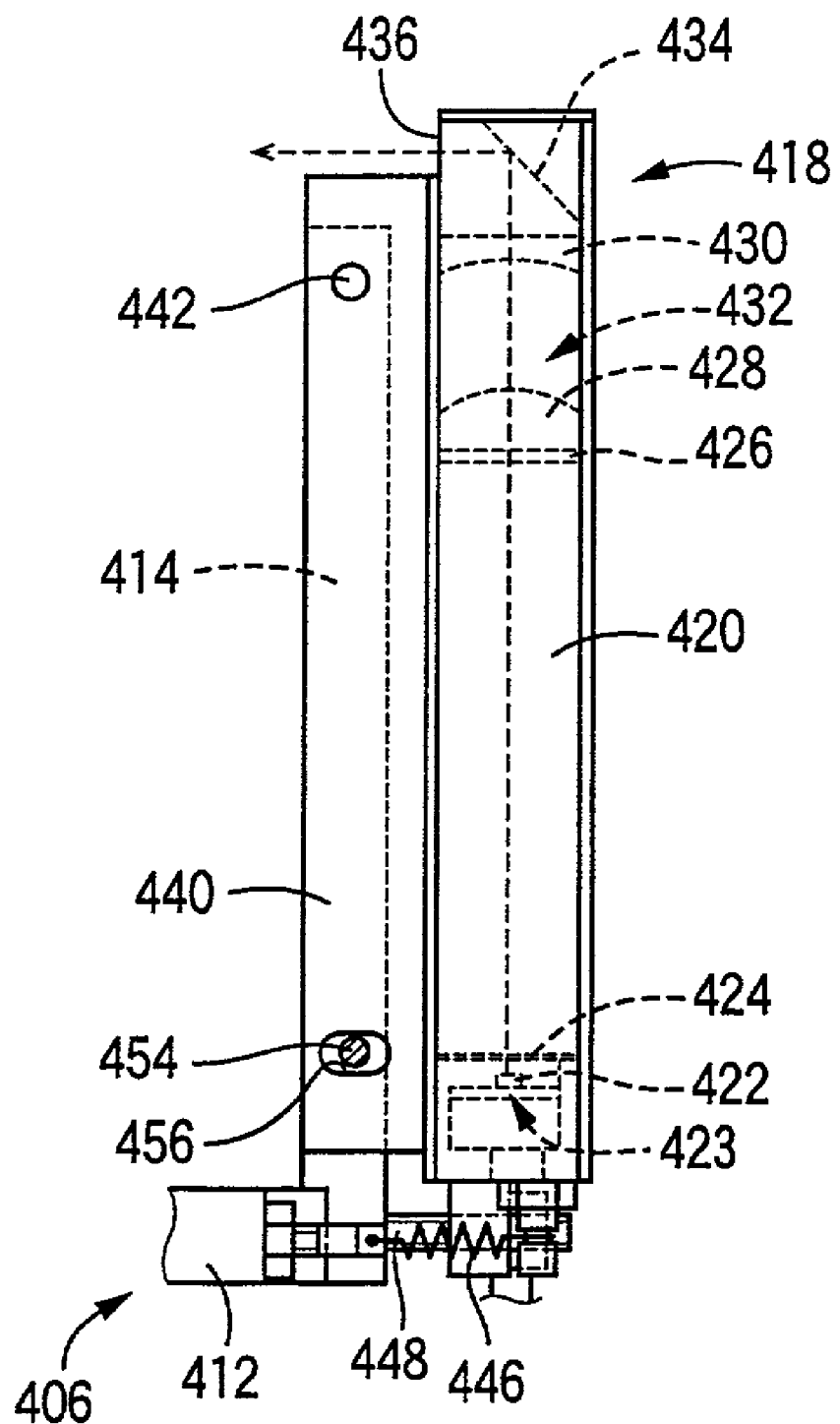
FIG. 26 is a side elevational view showing the state in which the projector of FIG. 24 is supported by the support member.
Figure 27:
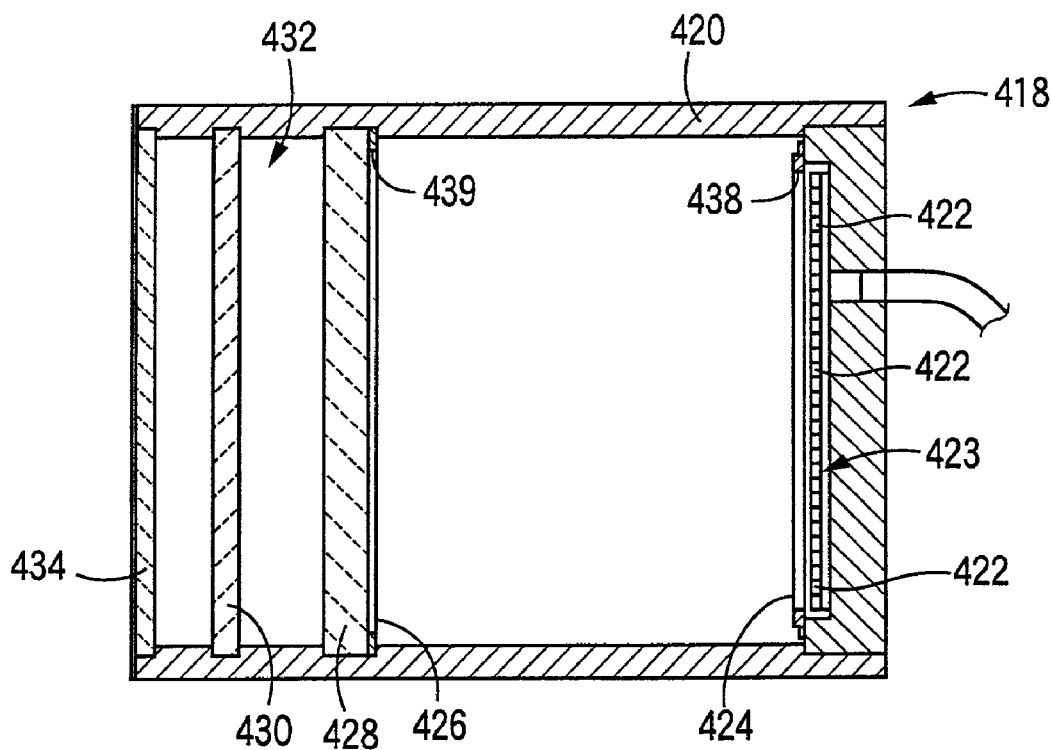
FIG. 27 is a front elevational view, in cross section, of the projector of FIG. 24.
Figure 28:
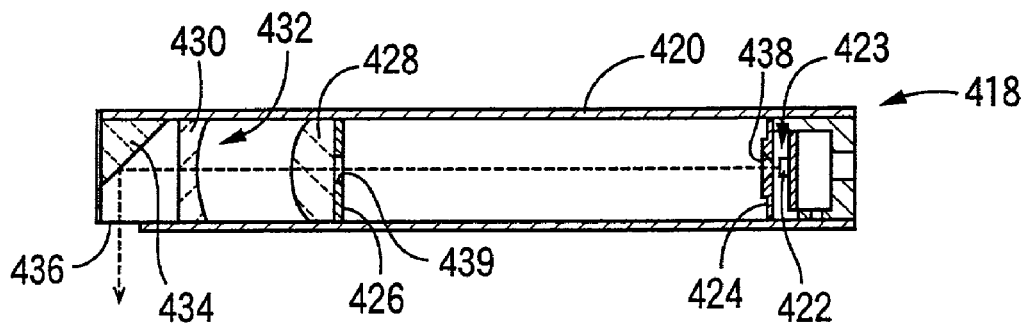
FIG. 28 is a side elevational view, in cross section, of the projector of FIG. 24.

As shown in FIG. 23, the support member 406 includes a flat main body 412 extending along a horizontal plane, and a plurality of (e.g., four) projector-supporting portions 414 extending vertically from an outer peripheral portion of the flat main body 412, perpendicularly to the same 412. As shown in FIGS. 24, 25, and 26, the four projector-supporting portions 414 are provided by respective flat members that are detachably attached, with respective attaching devices, not shown, such as bolts, to another flat member providing the flat main body 412, such that a first pair of supporting portions 414 and a second pair of supporting portions 414 are located, as shown in FIG. 22, on opposite sides of the locus of Y-axis-direction movement of the component holding head 100 on the X-axis slide 106, respectively. Each pair of supporting portions 414 are arranged in the Y-axis direction, and are inclined relative to the Y-axis direction such that respective first end portions of the supporting portions 414 that are distant from each other in the Y-axis direction are nearer to the locus of movement of the holding head 100 than the respective second end portions of the same 414. Thus, the four supporting portions 414 are so arranged as to define a portion of a closed line surrounding the center of the flat main body 412.

The local-illumination device 404 employs a plurality of (e.g., four) projectors 418. Since those projectors 418 have a same construction, one of the projectors 418 will be described in detail, below.

As shown in FIGS. 24 to 28, the projector 418 includes a casing 420, an array 423 of light emitting diodes 422 each as a light source, two slit members 424, 426, a group 432 of lenses including a convex lens 428, and a concave lens 430, and a total-reflection mirror 434. The array 423 of light emitting diodes 422, the two slit members 424, 426, the group 432 of lenses, and the total-reflection mirror 434 are provided in the casing 420. Each of the two slit members 424, 426 forms the lights emitted by the light emitting diodes 422, into a "slit" or planar light. The group 432 of lenses diffuses the slit light formed by the second slit member 426, without changing the thickness of the slit light. The total-reflection mirror 434 reflects the slit light diffused by the group 432 of lenses. The distance between the convex lens 428 and the concave lens 430 is so prescribed that the light incident to the leads 92 results in forming respective well-defined images of the leads 92. The two slit members 424, 426 have respective slits 438, 439, and form respective slit lights each having a rectangular cross section. The slit light reflected by the total-reflection mirror 434 is outputted through an outlet 436 of the casing 420. This slit light is a planar light having a prescribed thickness. As indicated at broken line in FIGS. 22 and 23, the projector 418 projects the planar light along a horizontal plane. The thickness of the planar light projected by the projector 418 is so prescribed as to illuminate a lengthwise limited portion of each of the leads 92. The thickness of the planar light is set at a prescribed value by selecting a distance between the convex lens 428 and the concave lens 430.

As shown in FIGS. 24 and 25, a pair of leg portions 440 are fixed to the casing 420, such that the leg portions 440 extend in a direction in which the array 423 of light emitting diodes, the slit members 424, 426, the group 432 of lenses, and the total-reflection mirror 434 are arranged. In a state in which the outlet 436 of the casing 420 is located in an upper end portion of the casing 420, the projector-supporting portion 414 fits in a space between the two leg portions 440, and supports the casing 420 via an axis member 442 such that the casing 420 is pivotable about the axis member 442. Thus, the supporting portion 414 supports the casing 420 or the projector 418 such that the projector 418 is pivotable about the axis member 442, in the vicinity of the outlet 436. That is, the projector 418 is supported by the supporting portion 414 such that the projector 418 is pivotable about a horizontal axis line which is distant from the leads 92, is perpendicular to the leads 92, and is parallel to the inclined direction which is inclined relative to the Y-axis direction and in which the supporting portion 414 extends.

Thus, the outlet 436 extends horizontally, and is inclined, like the projector-supporting portion 414, relative to the Y-axis direction. Accordingly, the respective lights projected by the four projectors 418 intersect one another on the locus of Y-axis-direction movement of the suction nozzle 184 on the X-axis slide 106.

As shown in FIGS. 24 and 26, the casing 420 is biased by a tension coil spring 446 as an elastic or biasing device that is provided between the projector-supporting portion 414 and a lower end portion of the casing 420 that is opposite to the outlet 436. The casing 420 is biased by the spring 446 in a direction toward the supporting portion 414. The limit of the pivotal movement of the casing 420 that is caused by the biasing action of the spring 446, is defined by abutting of an adjustor bolt 448 as an adjusting member that is threadedly engaged with the casing 420, against the supporting portion 414. Thus, the limit of pivotal movement of the casing 420 can be adjusted by adjusting the amount of threaded engagement of the adjustor bolt 448 with the casing 420, and consequently a direction (or an angle relative to a horizontal plane) in which the light reflected by the total-reflection mirror 434 and projected through the outlet 436 is transmitted in a vertical plane, i.e., a position where the light is incident to each lead 92 is adjusted. For example, the direction of transmission of the light projected by the projector 418 is so adjusted that the light is incident to a free end, and a portion adjacent to the free end, of each lead 92 of the connector 82 held by the component holding head 100. Thus, the coil spring 446 and the adjustor bolt 448 cooperate with each other to provide an adjusting device.

As shown in FIGS. 25 and 26, the casing 420 is fixed to the support member 406, with a bolt 454 as a fixing device. As Shown in FIG. 26, one of the two leg portions 440 has an elongate hole 456 that extends in a direction tangential to an arc whose center rides on the axis line about which the casing 420 is pivotable. The one leg portion 440 has the elongate hole 456 in a lower portion thereof opposite to the upper portion thereof that is pivotally attached to the support member 406 via the axis member 442. The bolt 454 is screwed with the projector-supporting portion 414 through the elongate hole 456, whereby the projector 414 is fixed to the support member 406.

As shown in FIGS. 22 and 23, the main body 412 of the support member 406 has, in a central portion thereof, an opening 460 formed in a vertical direction through the thickness thereof. The component camera 402 fits in the opening 460. Like the component camera 250, the component camera 402 is provided by a CCD camera, and is disposed such that an optical axis of the camera 402 is vertical and an image-forming surface thereof faces upward.

After the component holding head 100 holds the connector 82, the holding head 100 is moved toward the printed-wiring board 12 and, during this movement, the holding head 100 is stopped above the image-taking system 400, so that an image of the leads 92 of the connector 82 is taken. In the state in which the holding head 100 is stopped at the image-taking position, the leads 92 are illuminated with the lights transmitted from the four projectors 418 in the four directions directed toward the leads 92 in the plane perpendicular to the lengthwise direction of the leads 92. Respective images formed by the lights reflected by the leads 92 are taken by the component camera 402, on the side of the respective free ends of the leads 92, in a direction parallel to the lengthwise direction of each lead 92. The control device 300 processes the thus taken images and determines respective positions of the leads 92.

Figure 29:
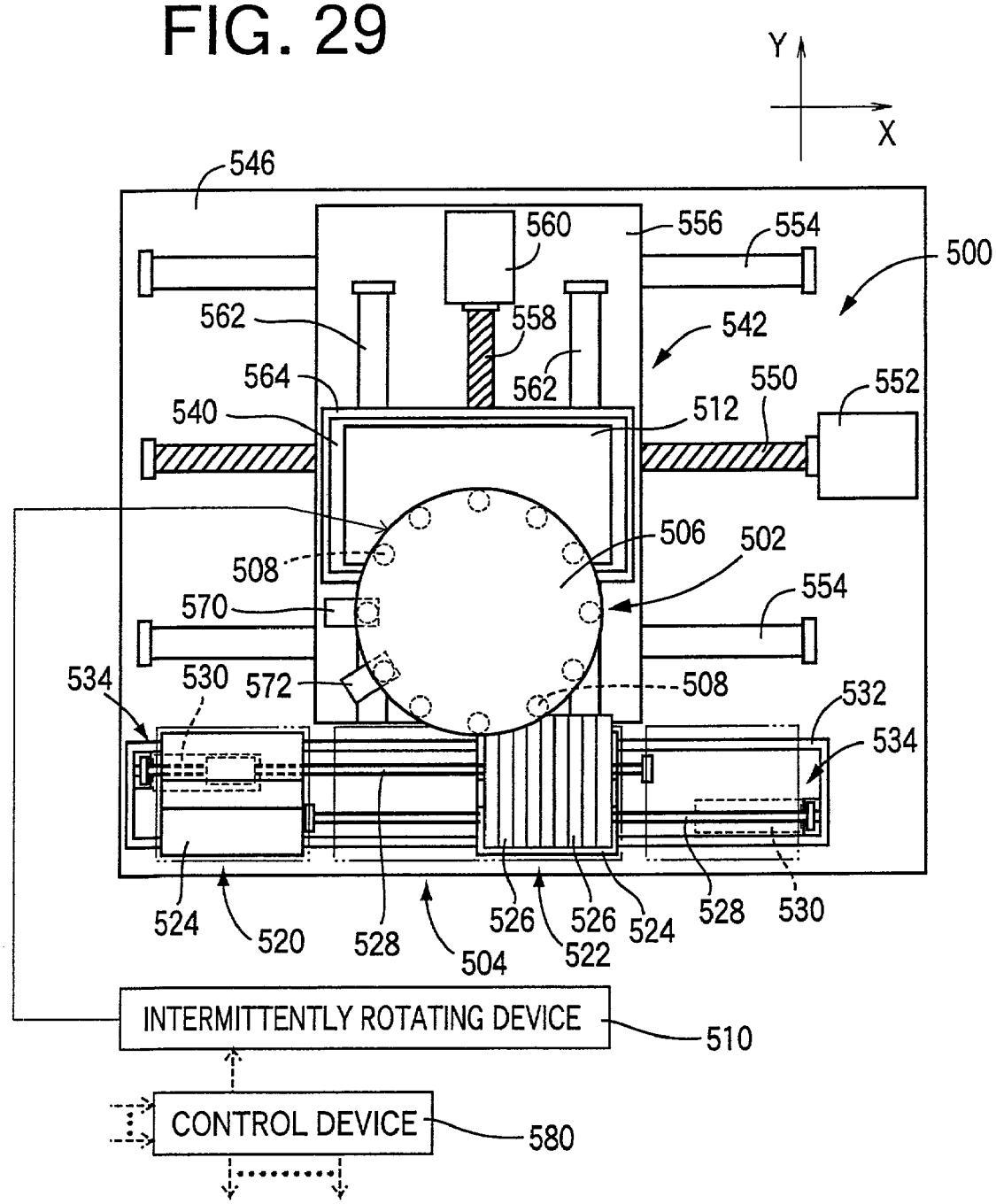
FIG. 29 is a plan view showing an intermittent-rotation-type electronic-component mounting system including a lead-position detecting device, to which the present invention is also applied.

The principle of the present invention is also applicable to the art of detecting a position of a lead of an electronic component in an electronic-component mounting system of a type, shown in FIG. 29, which includes a plurality of component holding heads which are supported by an intermittently rotatable table as a rotatable body that is rotatable about a vertical axis line and is immovable in a horizontal plane. The component holding heads hold respective electronic components. Since a circuit substrate is moved by a circuit-substrate moving device in the horizontal plane parallel to the substrate, each of the electronic components held by the holding heads can be mounted at an arbitrary position on the circuit substrate. Thus, this type of electronic-component mounting system is called a rotatable-table-type electronic-component mounting system or an intermittent-rotation-type electronic-component mounting system. In this system, too, leads of the electronic component held by each of the component holding heads are illuminated with a light in a direction substantially perpendicular to a lengthwise direction of each lead, and respective images of the leads are taken on the side of respective free ends of the leads in a direction parallel to the lengthwise direction of each lead. Based on the thus taken images, respective positions of the leads are detected. Hereinafter, there will be described the intermittent-rotation-type electronic-component mounting system.

In FIG. 29, reference numeral 500 designates a printed-wiring-board supporting device as a sort of a circuit-substrate supporting device; numeral 502 designates a component mounting device; and numeral 504 designates a component supply device. The component mounting device 502 includes an intermittently rotatable table 506 that is intermittently rotatable about a vertical axis line. The intermittently rotatable table 506 supports a plurality of component holding heads 508, such that the component holding heads 508 are equiangularly spaced from each other about the vertical axis. The rotatable table 506 is intermittently rotated by an intermittently rotating device 510 including an intermittently rotating motor, a cam, a cam follower, and an axis member, all not shown, so that each of the holding heads 508 is sequentially moved to, and positioned at, a plurality of operative stations including a component supplying station (i.e., a component taking station), two component-posture detecting stations, a component-posture correcting station, and a component mounting station. At those operative stations, the electronic component held by each of the holding heads 508 is subjected to respective operations needed for the mounting of the component on the board 512. The rotatable table 506 supports the component holding heads 508, such that each of the holding heads 508 is rotatable about an axis line and is movable relative to the table 506 in a direction parallel to the axis line.

The component supply device 504 includes two component supply tables 520, 522 each of which includes a feeder support table 524 and a plurality of component feeders 526 which are supported by the feeder support table 524 such that respective component supply portions of the feeders 526 are arranged along a horizontal straight line parallel to an X-axis direction perpendicular to a Y-axis direction. When a ballscrew 528 as a feed screw is rotated by a support-table moving motor 530, the feeder support table 524 is moved in the X-axis direction by being guided by guide rails 532, so that each of the respective component-supply portions of the feeders 526 is selectively moved to a position right below the component supplying station of the intermittently rotatable table 506. Thus, the ballscrew 528, the support-table moving motor 530, etc. cooperate with one another to provide a support-table moving device 534 or a table moving device. The component feeders 526 feed various types of electronic components, such as lead-insertion-type electronic components, flat-package-type electronic components, or leadless electronic components. FIG. 29 does not show component feeders 526 which are supported by the component supply table 520. The manner in which the two component supply tables 520, 522 cooperate with each other to supply the electronic components is well known in the art, and accordingly no further description thereof is provided here.

The printed-wiring-board supporting device 500 includes a board support unit 540 and a board-support-unit moving device 542 which moves the board support unit 540 to an arbitrary position on a horizontal X-Y plane defined by the X and Y axes. The board supporting device 500 is provided on a machine base 546 on which the component mounting device 502 and the component supply device 504 are also provided, and the board supporting device 500 receives a printed-wiring board 512 from a carry-in device, not shown. After electronic component are mounted on the board 512, the board supporting device 500 transfers the board 512 to a carry-out device, not shown. Each of the carry-in and carry-out devices includes a belt conveyor which conveys the board 512 in the X-axis direction.

The board-support-unit moving device 542 includes a ballscrew 550 as a feed screw that is provided on the machine base 546; an X-axis-direction drive motor 552 which rotates the ballscrew 550; an X-axis slide 556 which is linearly moved in the X-axis direction by being guided by a pair of guide rails 554 when the ballscrew 550 is rotated by the drive motor 552; a ballscrew 558 as a feed screw that is provided on the X-axis slide 556; a Y-axis-direction drive motor 560 which rotates the ballscrew 558; and a Y-axis slide 564 which is linearly moved in the Y-axis direction by being guided by a pair of guide rails 562 when the ballscrew 558 is rotated by the drive motor 560. The board support unit 540 is provided on the Y-axis slide 564. The various motors, such as the support-table moving motors 530, function as drive sources, and are provided by servomotors in the present embodiment.

An image-taking system 570 is provided at a position in the vicinity of one of the two component-posture detecting stations, so that the image-taking system 570 takes a projected image, or a reflected image, of the electronic component held by each of the component holding heads 508. The image-taking system 570 includes an illuminating device; a component camera as an image taking device that is provide by a CCD camera; and a light guiding device. The light guiding device is provided at a position right below a locus of movement of each holding head 508, and guides or introduces an image-forming Light into the CCD camera provided at a position radially outward of the locus of movement.

Another image-taking system 572 is provided at a position in the vicinity of the other component-posture detecting station, so that the image-taking system 572 takes respective images of leads of the electronic component held by each of the component holding heads 508. The image-taking system 572 may have a construction identical with that of the image-taking system 242 or the image-taking system 400, and illuminates the leads of the electronic component held by each of the component holding heads 508, with a light incident thereto in a direction perpendicular to a lengthwise direction of each lead, and takes respective images of the leads, on the side of respective free ends of the leads, in a direction parallel to the lengthwise direction of each lead. Although the local-illumination device of the system 572 is provided in the vicinity of the locus of movement of each holding head 508, the component camera (i.e., the CCD camera) as a sort of surface-image taking device is fixedly provided at a position offset radially outward from the locus of movement of each holding head 508, such that the component camera faces downward. An image-forming light reflected by the leads is guided or introduced by the light guiding device of the system 572 into the component camera. The present electronic-component mounting system is controlled by a control device 580 which is essentially provided by a computer.

When electronic components are mounted on the printed-wiring board 512, the intermittently rotatable table 506 is intermittently rotated by the intermittently rotating device 510, so that first the component holding heads 508 sequentially receive, at the component supplying or taking station, respective electronic components from the component feeders 526. When the component holding head 508 holding a lead-insertion-type electronic component is stopped at the component-posture detecting station where the second image-taking system 572 is provided, so that images of the leads of the electronic component are taken by the component camera and respective positions of the leads are detected. Based on the thus detected positions of the leads, the control device 580 judges whether the electronic component can be mounted on the printed-wiring board 512. If a positive judgment is made, the control device 580 corrects or modifies reference amounts of movement of the board-support-unit moving device 542 to move the board support unit 540, i.e., the printed-wiring board 512, and corrects or changes the current angular position of the holding head 508, so that the leads of the electronic component are inserted in the insertion holes of the board 512. A stationary fiducial-mark camera, not shown, takes respective images affixed to the printed-wiring board 512, and, based on the thus taken images, the control device 580 determines positional errors of the board 512 and respective positional errors of each of the insertion holes. Those positional errors of each insertion hole are also corrected by correcting or modifying reference amounts of movement of the board-support-unit moving device 542 to move the printed-wiring board 512, and changing the current angular position of the holding head 508.

The local-illumination device may be one which is capable of changing a thickness of a planar light that is produced thereby to illuminate respective limited portions of leads, depending upon a desirable width of each of those limited portions. Alternatively, it is possible to prepare a plurality of local-illumination devices that produce respective planar lights having different thickness values and select an appropriate one of the devices depending upon a desired width of the limited portions of the leads.

In each of the illustrated embodiments, the component holding head 100, 508 is stopped when an image of an electronic component is taken. However, the image may be taken without stopping the holding head 100, 508. For example, in the case where the local-illumination device is one which includes a stroboscopic lamp and a high-speed camera, the stroboscopic lamp illuminates, with a strong light, only a lengthwise limited portion of a lead of an electronic component passing by, and an image of the lead is taken by the high-speed camera. Although the electronic component is moving, the image of the lead can be taken as if it were still, by employing a very high shutter speed or a very short illumination time.

In the first embodiment shown in FIG. 2, the component holding head 100 holding the electronic component 82 is moved to an arbitrary position in the plane parallel to the surface of the printed-wiring board 12, so as to mount the component 82 on the board 12. In this embodiment, stationary local-illumination and image-taking devices may be provided at an image-taking position on, e.g., the machine base 10, and the component holding head 100 may be adapted such that the holding head 100 is moved to the image-taking position where images of leads of the electronic component 82 is taken by the image-taking device.

In the first embodiment shown in FIGS. 1 to 20, the image taking system 242 for taking the images of the leads 92 of the electronic component 82 is provided, on the X-axis slide 106, at the position between the tray-type component supply device 22 and the printed-wiring board 12, and the image taking system 240 for taking the projected or reflected image of the electronic component 82 is provided, on the X-axis slide 106, at the position between the feeder-type component supply device 20 and the printed-wiring board 12. However, if necessary, for example, if the tray-type component supply device 22 supplies electronic components whose projected or reflected images need to be taken, the two image-taking systems 240, 242 may be provided, on the X-axis slide 106, at each of the position between the tray-type supply device 22 and the board 12 and the position between the feeder-type supply device 20 and the board 12. In this case, the two image-taking systems 240, 242 are arranged in the Y-axis direction.

In the embodiment shown in FIG. 29, at least one of the two image-taking systems 570, 572 may be modified such that the one system does not employ a light guiding device and the component camera of the one system is provided at a position right below the locus of movement of each component holding head 508, so as to be able to face the each head 508 in a vertically upward direction.

The principle of the present invention is also applicable to a component mounting device which includes a component holding head and a head moving device that moves the holding head in one of two directions perpendicular to each other in a plane parallel to a component-mounting surface of a circuit substrate. In this case, a board support device that supports the circuit board is moved in the other of the two directions. A component supply device may be one which is movable in the other direction, or one which is stationary.

The principle of the present invention is further applicable to a component mounting device which includes a rotatable table that is rotatable by an arbitrary angle in each of opposite directions; a plurality of component holding heads that are supported by the rotatable table; and a rotating device that rotates the rotatable table so that the holding heads hold respective electric components and mounts the components on a circuit substrate.

The principle of the present invention is additionally applicable to a component mounting apparatus which includes a movable member; a rotatable-table-type component mounting device (e.g., an intermittent-rotation-type component mounting device) that is supported by the movable member and supports a plurality of component holding heads; and a moving device that moves the movable member. In this component mounting apparatus, each of the holding heads is revolved about an axis line of the rotatable-table-type component mounting device, while being moved relative to a circuit substrate because of the movement of the movable member. Thus, the holding heads mounts respective electric components on the circuit substrate.

The principle of the present invention is also applicable to a component mounting device which includes a plurality of component holding heads that are respectively supported by a plurality of rotary members each of which is revoluble about a common axis, independent of the other rotary members. In this case, a rotary-motion applying device applies a rotary motion to each of the rotary members, such that the each rotary member is fully revoluble about the common axis line while being stopped at least one time during each full revolving and keeping a prescribed time duration after its preceding rotary member and before its following rotary member. The component holding heads are respectively supported by the rotary members at respective positions equally distant from the common axis line.

The present invention is applicable to the art of detecting a position of a lead having any transverse-cross-sectional shape other than the square shape; such as a circular shape, a rectangular shape, a triangular shape, etc. Usually, each of insertion holes of a printed wiring board has a circular transverse-cross-sectional shape. However, the present invention is applicable to the art of detecting a position of a lead that is inserted in a hole having a transverse-cross-sectional shape other than the circular shape; such as a square or rectangular shape.

The present invention is also applicable to the art of detecting a position of a lead of an electric component that is connected to a connection portion of a circuit substrate other than the insertion hole; such as a circuit pattern formed on the surface of the circuit substrate.

The lead-position detecting method and apparatus according to the present invention are capable of detecting a position of a lead of an electric component that is not for being mounted on a circuit substrate.

While the preferred embodiments of the present invention have been described in detail, it is to be understood that the present invention is not limited to the details of the described embodiments but may be embodied with various changes and improvements, such as those described in SUMMARY OF THE INVENTION, that may occur to a person skilled in the art without departing from the spirit and scope of the invention defined in the appended claims.

What is claimed is:

1. A method of detecting a position of at least one lead of an electric component which additionally includes a body from which said at least one lead extends, the method comprising the steps of illuminating, with a light incident to said at least one lead in a direction substantially perpendicular to a lengthwise direction thereof, a lengthwise limited portion of said at least one lead without illuminating a base end portion thereof that is adjacent to the body, taking an image of the lengthwise limited portion of said at least one lead, on a side of a free end thereof, in a direction parallel to the lengthwise direction thereof, and detecting the position of said at least one lead by processing image data representing the taken image.

2. The method according to claim 1, wherein the electric component includes a plurality of said leads, and wherein the step of detecting the position of said at least one lead comprises detecting a position of one of the leads relative to a position of the other lead.

3. The method according to claim 1, wherein the light comprises a planar light which is incident to said at least one lead along a plane substantially perpendicular to the lengthwise direction thereof.

4. The method according to claim 1, wherein the limited portion of said at least one lead is distant from the free end thereof by a predetermined distance toward the base end portion thereof.

5. The method according to claim 1, wherein the limited portion of said at least one lead consists of the free end thereof and a portion thereof adjacent to the free end.

6. The method according to claim 1, wherein the step of illuminating the limited portion of said at least one lead comprises illuminating a substantially entire, outer circumferential surface of the limited portion of said at least one lead with the light incident thereto in a plurality of directions substantially directed to said at least one lead in a plane substantially perpendicular to the lengthwise direction of said at least one lead.

7. The method according to claim 6, wherein the plurality of directions comprise at least three directions.

8. The method according to claim 1, wherein the light comprises a laser light.

9. The method according to claim 1, wherein the step of illuminating the limited portion of said at least one lead comprises illuminating the limited portion of said at least one lead of the electric component held by a component holding head, with the light incident thereto, and wherein the step of taking the image of said at least one lead comprises taking the image of said at least one lead of the electric component held by the component holding head, on the side of the free end of said at least one lead, in the direction parallel to the lengthwise direction thereof.

10. The method according to claim 9, further comprising a step of moving the component holding head holding the electric component, in a direction substantially perpendicular to the lengthwise direction of said at least one lead, wherein the step of taking the image of said at least one lead comprises taking the image of said at least one lead of the electric component held by the holding head, midway on a locus of movement of said at least one lead.

11. The method according to claim 10, wherein the step of illuminating the limited portion of said at least one lead comprises illuminating the limited portion of said at least one lead of the electric component held by the component holding head, with the light incident thereto from a projector provided at a position offset from the locus of movement of said at least one lead.

12. The method according to claim 1, wherein the electric component comprises a connector which includes said at least one lead and which is mounted on a circuit substrate such that said at least one lead is inserted in at least one hole formed in the circuit substrate.

13. A method of mounting, on a circuit substrate, an electric component including a body and at least one lead extending from the body, the method comprising the steps of holding, with a component holding head, the electric component, carrying out the method of claim 1, wherein the step of illuminating comprises:

illuminating the lengthwise limited portion of said at least one lead of the electric component held by the component holding head, and modifying, based on data representing the detected position of said at least one lead, data representing a reference position of one of the component holding head and the circuit substrate relative to the other of the holding head and the circuit substrate, and inserting said at least one lead of the electric component in at least one hole formed in the circuit substrate.

14. The method according to claim 1, wherein the step of illuminating the lengthwise limited portion of said at least one lead comprises illuminating an outer surface of the lengthwise limited portion, the outer surface extending in the lengthwise direction of said at least one lead parallel to the direction in which the image of the lengthwise limited portion is taken, and wherein the step of taking the image comprises taking an image of the outer surface of the lengthwise limited portion, on the side of the free end of said at least one lead, in the direction parallel to the lengthwise direction thereof.

15. An apparatus for detecting a position of at least one lead of an electric component which additionally includes a body from which said at least one lead extends, the apparatus comprising:

a locally illuminating device which illuminates, with a light incident to said at least one lead in a direction substantially perpendicular to a lengthwise direction thereof, a lengthwise limited portion of said at least one lead without illuminating a base end portion thereof that is adjacent to the body;

an image taking device which takes an image of the lengthwise limited portion of said at least one lead, on a side of a free end thereof, in a direction parallel to the lengthwise direction thereof; and an image processing device which detects the position of said at least one lead by processing image data representing the image taken by the image taking device.

16. The apparatus according to claim 15, further comprising a support member which supports the locally illuminating device and the image taking device.

17. The apparatus according to claim 16, wherein the support member comprises:

a flat base portion which has, in a central portion thereof, an opening in which the image-taking device fits; and a holding portion which extends from the flat base portion in a direction perpendicular to the flat base portion and which supports the locally illuminating device.

18. The apparatus according to claim 17, wherein the locally illuminating device comprises a plurality of projectors and wherein the holding portion of the support member comprises a plurality of projector-holding portions which extend from an outer peripheral portion of the flat base portion in the direction perpendicular to the flat base portion and which support the plurality of projectors of the locally illuminating device, respectively.

19. The apparatus according to claim 15, wherein the locally illuminating device comprises at least one projector which has an outlet and projects the light through the outlet, and wherein the apparatus further comprises:

a support member which supports the projector such that the projector is pivotable about an axis line which is spaced from said at least one lead and is perpendicular to said at least one lead; and an adjusting device which is provided between the projector and the support member and which adjusts an angular position of the projector relative to the support member and thereby adjusts a position where the light projected by the projector is incident to said at least one lead.

20. The apparatus according to claim 19, wherein the projector has the outlet thereof in a vicinity of the axis line thereof.

21. The apparatus according to claim 15, wherein the locally illuminating device emits a planar light which is incident to said at least one lead along a plane substantially perpendicular to the lengthwise direction thereof.

22. The apparatus according to claim 15, wherein the locally illuminating device illuminates a substantially entire, outer circumferential surface of the limited portion of said at least one lead with the light incident thereto in a plurality of directions substantially directed to said at least one lead in a plane substantially perpendicular to the lengthwise direction of said at least one lead.

23. The apparatus according to claim 15, wherein the locally illuminating device illuminates an outer surface of the lengthwise limited portion of said at least one lead, the outer surface extending in the lengthwise direction of said at least one lead parallel to the direction in which the image taking device takes the image of the lengthwise limited portion, and wherein the image taking device takes an image of the outer surface of the lengthwise limited portion, on the side of the free end of said at least one lead, in the direction parallel to the lengthwise direction thereof.

* * * * *